(12) United States Patent
Furuhashi et al.

(10) Patent No.: US 6,564,352 B1
(45) Date of Patent: May 13, 2003

(54) ERROR DETECTION CIRCUIT APPLICABLE TO A DISK REPRODUCTION APPARATUS

(75) Inventors: Shinobu Furuhashi, Shimotsuga-gun (JP); Nobuhiro Sato, Ebina (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/392,721

(22) Filed: Sep. 9, 1999

(30) Foreign Application Priority Data

Sep. 10, 1998 (JP) .......................................... 10-256924

(51) Int. Cl.⁷ .......................... G06F 11/10; H03M 13/00
(52) U.S. Cl. ........................................ 714/801; 714/785
(58) Field of Search ................................. 714/801, 785, 714/784, 781, 746, 758, 804, 799

(56) References Cited

U.S. PATENT DOCUMENTS

| | | | | |
|---|---|---|---|---|
| 4,740,968 A | | 4/1988 | Aichelmann, Jr. | 714/703 |
| 6,041,431 A | * | 3/2000 | Goldstein | 714/784 |
| 6,205,568 B1 | * | 3/2001 | Kodama | 714/755 |
| 6,260,169 B1 | * | 7/2001 | Massoudi | 714/769 |
| 6,405,343 B1 | * | 6/2002 | Chiang | 714/804 |

* cited by examiner

*Primary Examiner*—Phung M. Chung
(74) *Attorney, Agent, or Firm*—Oblon, Spivak, McClelland, Maier & Neustadt, P.C.

(57) ABSTRACT

To an error detection circuit in a decoder, data is supplied which contains an ECC parity sent from a player side of a disk into a decode system. Syndromes for P- and Q-corrections are calculated based on the data contained in the ECC parity. It is, therefore, possible to detect an error with high accuracy.

17 Claims, 19 Drawing Sheets

FIG. 2

|   | 0 | 1 | 2 | ... | ... | ... | 41 | 42 |   |
|---|---|---|---|-----|-----|-----|----|----|---|
| 0 | 0000 | 0001 | 0002 | ... | ... | ... | 0041 | 0042 | HEADER |
| 1 | 0043 | 0044 | 0045 | ... | ... | ... | 0084 | 0085 | + |
| 2 | 0086 | 0087 | 0088 | ... | ... | ... | 0127 | 0128 | USER DATA |
| 3 | 0129 | 0130 | 0131 | ... | ... | ... |  | 0171 | + |
| 4 | 0172 | 0173 | ... |  |  |  |  | 0214 | DIGITAL 0 |
| 22 | 0946 | 0947 | 0948 | ... | ... | ... | 0987 | 0988 |  |
| 23 | 0989 | 0990 | 0991 | ... | ... | ... | 1030 | 1031 |  |
| 24 | 1032 | 1033 | 1034 | ... | ... | ... | 1072 | 1073 1074 | P PARITY |
| 25 | 1075 | 1076 | 1077 | ... | ... | ... | 1115 | 1116 1117 |  |
| 26 | 1118 | 1119 | 1120 | ... | 1143 |  |  |  | Q PARITY |
| 27 | 1144 | 1145 | 1146 | ... | 1169 |  |  |  |  |

Columns: 0  1  2 .... 25

|   | 0 | 1 | 2 | ... | ... | 41 | 42 | Q0 | Q1 |
|---|---|---|---|-----|-----|----|----|----|----|
| 0 | 0000 | 0044 | 0088 | —Q→ ... | ... | 0686 | 0730 | 1118 | 1144 |
| 1 | 0043 | 0087 | 0131 | ... | ... | 0729 | 0773 | 1119 | 1145 |
| 2 | 0086 | 0130 | 0174 | ... | ... | 0772 | 0816 | 1120 | 1146 |
| 3 | 0129 | 0173 | 0217 | ... | ... | 0041 | 0859 | 1121 | 1147 |
| 4 | 0172 | 0216 | ... |  |  | 0041 | 0902 | 1122 | 1148 |
| 22 | 0946 | 0990 | 1034 | ... | ... | 0514 | 0558 | 1140 | 1166 |
| 23 | 0989 | 1033 | 1077 | ... | ... | 0557 | 0601 | 1141 | 1167 |
| 24 | 1032 | 1076 | 0002 | ... | ... | 0556 | 0600 0644 | 1142 | 1168 |
| 25 | 1075 | 0001 | 0045 | ... | ... | 0599 | 0643 0687 | 1143 | 1169 |

$$A_0 = \sum_{i=0}^{42} d_i$$

| | $A_0$ | $A_1$ | $A_2$ | $A_3$ | $A_4$ | ... | $A_{22}$ | $A_{23}$ | $A_{24}$ | $A_{25}$ |
|---|---|---|---|---|---|---|---|---|---|---|
| $\alpha^{25}$ | $d_0$ | $d_1$ | $d_2$ | $d_3$ | | | | | | |
| $\alpha^{24}$ | $d_{43}$ | $d_{44}$ | $d_{45}$ | $d_{46}$ | | | | | | |
| $\alpha^{23}$ | $d_{86}$ | $d_{87}$ | $d_{88}$ | $d_{89}$ | | | | | | |
| $\alpha^{22}$ | $d_{129}$ | $d_{130}$ | $d_{131}$ | $d_{132}$ | | | | | | |
| $\alpha^{21}$ | $d_{172}$ | $d_{173}$ | $d_{174}$ | $d_{175}$ | | | | | | |
| | . | | | | | | | | | |
| | . | | | | | | | | | |
| | . | | | | | | | | | |
| $\alpha^3$ | $d_{946}$ | $d_{947}$ | $d_{948}$ | $d_{949}$ | | | | | | |
| $\alpha^2$ | $d_{989}$ | $d_{990}$ | $d_{991}$ | $d_{992}$ | | | | | | |
| $\alpha^1$ | $d_{1032}$ | $d_{1033}$ | $d_{1034}$ | $d_{1035}$ | | | | | | |
| $\alpha^0$ | $d_{1075}$ | $d_{1076}$ | $d_{1077}$ | $d_{1078}$ | | | | | | |

| | $A_0$ | $A_1$ | $A_2$ | $A_3$ | $A_4$ | ... | $A_{22}$ | $A_{23}$ | $A_{24}$ | $A_{25}$ |
|---|---|---|---|---|---|---|---|---|---|---|
| | | | | | | | $d_{986}$ | $d_{987}$ | $d_{988}$ | |
| | | | | | | | $d_{1029}$ | $d_{1030}$ | $d_{1031}$ | |
| | | | | | | | $d_{1072}$ | $d_{1073}$ | $d_{1074}$ | |
| | | | | | | | $d_{1115}$ | $d_{1116}$ | $d_{1117}$ | |

| | | |
|---|---|---|
| $A_0$ | | $A_0$ |
| $A_1$ | | $\alpha A_0 + A_1$ |
| $A_2$ | | $\alpha(\alpha A_0 + A_1) + A_2 = \alpha^2 A_0 + \alpha A_1 + A_2$ |
| $A_3$ | | $\alpha(\alpha^2 A_0 + \alpha A_1 + A_2) + A_3 = \alpha^3 A_0 + \alpha^2 A_1 + \alpha A_2 + A_3$ |
| $A_4$ | | $\alpha(\alpha^3 A_0 + \alpha^2 A_1 + \alpha A_2 + A_3) + A_4 = \alpha^4 A_0 + \alpha^3 A_1 + \alpha^2 A_2 + \alpha A_3 + A_4$ |
| ... | | |
| $A_{22}$ | | $\alpha(\alpha^{21} A_0 + \alpha^{20} A_1 + \cdots + \alpha A_{20} + A_{21}) + A_{22} = \alpha^{22} A_0 + \alpha^{21} A_1 + \cdots + \alpha A_{21} + A_{22}$ |
| $A_{23}$ | | $\alpha(\alpha^{22} A_0 + \alpha^{21} A_1 + \cdots + \alpha A_{21} + A_{22}) + A_{23} = \alpha^{23} A_0 + \alpha^{22} A_1 + \cdots + \alpha A_{22} + A_{23}$ |
| $A_{24}$ | | $\alpha(\alpha^{23} A_0 + \alpha^{22} A_1 + \cdots + \alpha A_{22} + A_{23}) + A_{24} = \alpha^{24} A_0 + \alpha^{23} A_1 + \cdots + \alpha A_{23} + A_{24}$ |
| $A_{25}$ | | $\alpha(\alpha^{24} A_0 + \alpha^{23} A_1 + \cdots + \alpha A_{23} + A_{24}) + A_{25} = \alpha^{25} A_0 + \alpha^{24} A_1 + \cdots + \alpha A_{24} + A_{25}$ |

$$\sum_{i=0}^{1117} \alpha^{25-(i/43)} \cdot d_i$$

FIG. 4

FIG. 6A and FIG. 6B $\beta_0 = \alpha^{42}d_0 + \alpha^{41}d_1 + \alpha^{40}d_2 + \cdots + \alpha^2 d_{40} + \alpha d_{41} + d_{42}$ $\beta_1 = \alpha^{42}d_{43} + \alpha^{41}d_{44} + \alpha^{40}d_{45} + \cdots + \alpha^2 d_{83} + \alpha d_{84} + d_{85}$

| $d_0$ | $d_1$ | $d_2$ | $d_3$ | . | . | . | $d_{24}$ | $d_{25}$ | $d_{26}$ | . | . | $d_{40}$ | $d_{41}$ | $d_{42}$ |
|---|---|---|---|---|---|---|---|---|---|---|---|---|---|---|
| $d_{43}$ | $d_{44}$ | $d_{45}$ | $d_{46}$ | | | | $d_{67}$ | $d_{68}$ | $d_{69}$ | $d_{70}$ | | $d_{83}$ | $d_{84}$ | $d_{85}$ |
| $d_{86}$ | $d_{87}$ | $d_{88}$ | $d_{89}$ | | | | $d_{110}$ | $d_{111}$ | $d_{112}$ | | | $d_{126}$ | $d_{127}$ | $d_{128}$ |
| $d_{129}$ | $d_{130}$ | $d_{131}$ | $d_{132}$ | | | | | | | | | $d_{169}$ | $d_{170}$ | $d_{171}$ |
| $d_{172}$ | $d_{173}$ | $d_{174}$ | $d_{175}$ | | | | | | | | | $d_{212}$ | $d_{213}$ | $d_{214}$ |
| | | | | | | | | | | | | | | |
| | | | | | | | | | | | | $d_{642}$ | | |
| | | | | | | | | | | | | | | $d_{686}$ |
| | | | | | | | | | | | | | | |
| | | | | | | | | | | | | | | $d_{730}$ |
| | | | | | | | | | | | | | | |
| | | | | | | | | | | | | | | |
| $d_{946}$ | $d_{947}$ | $d_{948}$ | $d_{949}$ | | | | $d_{970}$ | $d_{971}$ | $d_{972}$ | | | $d_{986}$ | $d_{987}$ | $d_{988}$ |
| $d_{989}$ | $d_{990}$ | $d_{991}$ | $d_{992}$ | | | | $d_{1013}$ | $d_{1014}$ | $d_{1015}$ | | | $d_{1029}$ | $d_{1030}$ | $d_{1031}$ |
| $d_{1032}$ | $d_{1033}$ | $d_{1034}$ | $d_{1035}$ | | | | $d_{1056}$ | $d_{1057}$ | $d_{1058}$ | | | $d_{1072}$ | $d_{1073}$ | $d_{1074}$ |
| $d_{1075}$ | $d_{1076}$ | $d_{1077}$ | $d_{1078}$ | | | | $d_{1099}$ | $d_{1100}$ | $d_{1101}$ | | | $d_{1115}$ | $d_{1116}$ | $d_{1117}$ |

} P PARITY $\beta_0 + \beta_1 = \beta_0 \alpha^{42} d_{43} + \alpha^{41} d_{44} + \cdots + \alpha \, d_{84} + d_{85}$ $\alpha^{42} \beta_0 \alpha^{-42} + \alpha^{42} \, d_{43} + \cdots + \alpha \, d_{84} + d_{85}$ $(\beta_0 \alpha^{-42} + d_{43}) \alpha^{42}$ $(\alpha^{-n} = \alpha^{-n \bmod 254})$

$(d_i(i=0\sim1169))$: THE ORDER OF INPUTTING DATA INTO A DECODER

| $A_0$ | $A_1$ | $A_2$ | $A_3$ | | | | | $A_{40}$ | $A_{41}$ | $A_{42}$ | $A_{43}$ | $A_{44}$ |
|---|---|---|---|---|---|---|---|---|---|---|---|---|
| $d_0$ | $d_{44}$ | $d_{88}$ | $d_{132}$ | | | | | $d_{642}$ | $d_{686}$ | $d_{730}$ | $d_{1118}$ | $d_{1144}$ |
| $d_{43}$ | $d_{87}$ | $d_{131}$ | $d_{175}$ | | | | | $d_{685}$ | $d_{729}$ | $d_{773}$ | $d_{1119}$ | $d_{1145}$ |
| $d_{86}$ | $d_{130}$ | $d_{174}$ | | | | | | $d_{728}$ | $d_{772}$ | $d_{816}$ | $d_{1120}$ | $d_{1146}$ |
| $d_{129}$ | $d_{173}$ | | | | | | | $d_{771}$ | $d_{815}$ | $d_{859}$ | $d_{1121}$ | $d_{1147}$ |
| $d_{172}$ | | | | | | | | $d_{814}$ | $d_{858}$ | $d_{902}$ | $d_{1122}$ | $d_{1148}$ |
| . | . | . | . | . | . | . | . | . | . | . | . | . |
| $d_{1032}$ | $d_{1076}$ | $d_2$ | $d_{46}$ | | | | | $d_{556}$ | $d_{600}$ | $d_{644}$ | $d_{1142}$ | $d_{1168}$ |
| $d_{1075}$ | $d_1$ | $d_{45}$ | $d_{89}$ | | | | | $d_{599}$ | $d_{643}$ | $d_{687}$ | $d_{1143}$ | $d_{1169}$ |

⇒ ($a_i$): REPLACEMENT DATA FOR CONVENIENCE OF EXPLANATION

| $A_0$ | $A_1$ | $A_2$ | $A_3$ | | | | | $A_{40}$ | $A_{41}$ | $A_{42}$ | $A_{43}$ | $A_{44}$ |
|---|---|---|---|---|---|---|---|---|---|---|---|---|
| $a_0$ | $a_1$ | $a_2$ | $a_3$ | | | $a_{24}$ | $a_{25}$ | $a_{26}$ | $a_{27}$ | $a_{42}$ | $a_{43}$ | $a_{44}$ |
| $a_{45}$ | $a_{46}$ | $a_{47}$ | $a_{48}$ | | | | | $a_{85}$ | $a_{86}$ | $a_{87}$ | $a_{88}$ | $a_{89}$ |
| $a_{90}$ | $a_{91}$ | $a_{92}$ | | | | | | $a_{130}$ | $a_{131}$ | $a_{132}$ | $a_{133}$ | $a_{134}$ |
| $a_{135}$ | $a_{136}$ | | | | | | | $a_{175}$ | $a_{176}$ | $a_{177}$ | $a_{178}$ | $a_{179}$ |
| $a_{180}$ | | | | | | | | $a_{220}$ | $a_{221}$ | $a_{222}$ | $a_{223}$ | $a_{224}$ |
| . | . | . | . | . | . | . | . | . | . | . | . | . |
| $a_{1080}$ | $a_{1081}$ | $a_{1082}$ | $a_{1083}$ | | | | | $a_{1120}$ | $a_{1121}$ | $a_{1122}$ | $a_{1123}$ | $a_{1124}$ |
| $a_{1125}$ | $a_{1126}$ | $a_{1127}$ | $a_{1128}$ | | | | | $a_{1165}$ | $a_{1166}$ | $a_{1167}$ | $a_{1168}$ | $a_{1169}$ |

X → | Y → | Z

ERROR DETECTION CIRCUIT APPLICABLE TO A DISK REPRODUCTION APPARATUS

BACKGROUND OF THE INVENTION

The present invention relates to an error detection circuit applicable to an optical disk reproduction apparatus, such as a CD-ROM, and adapted to detect an error in a signal reproduced from an optical disk.

The recent trend is that optical disks are rotated at high speed, thereby reproducing data from the disks at high speed. Therefore, there is demand for an optical disk reproduction apparatus that can transfer data at a high rate. In general, data recorded on the optical disk, after being reproduced by a player, is transferred to a decode system through a signal processing circuit. The reproduced data is divided into data blocks called "sectors" and sent into a decode system.

Each sector data sent into the decode system contains, for example, a synchronizing signal SYNC representing a head of the block, HEADER and SUB HEADER having information on a position and mode form, USER DATA having user information, error detection code EDC, ECC parity of an error correction code, etc. These data contents differ from format mode to format mode. The format mode corresponds to data contents of one sector in a CD-ROM format mode of a MODE2 FORM1.

For a decoder (for example, a CD-ROM decoder) in the decode system it is necessary to end the following functions (a) to (c) in a time inversely proportional to the reproduction speed of the disk.
(a) write transferred data into a buffer RAM.
(b) effect error detection and error correction of data.
(c) transfer data of a buffer RAM to a computer.

In order to improve the reproduction speed, therefore, it is necessary to have a very high access capability upon access to the buffer RAM.

In the decoder, error correction processing is made on per-sector data supplied from a player on the basis of a decided algorithm. This algorithm is of two types and either one of the following algorithms is adopted. The first algorithm is executed without any relation to the presence or absence of an error. The second algorithm performs error correction processing only when the error is detected.

In the case of adopting the first algorithm, with an improving reproduction speed of the disk, it is necessary that a capability of access to the buffer RAM, that is, the performance of error correction processing, be made very high. In order to effect error correction per sector, therefore, it is necessary to complete a series of access operations prior to transferring the next sector data.

The second algorithm decides the necessity for performing error correction processing through the utilization of an error detection code (EDC) initially containing the per-sector data supplied into the decode system and Interpolation Flag (IPF) (for example, a C2 correction flag, C2 correction failure flag or correction flag, etc.). If no error correction processing is required as a result of the decision, corresponding data is transferred to a host computer without performing the error correction processing.

The above-mentioned EDC contains data which is recorded on the disk as set out above. The IPF is added by an error correction system in a player upon signal processing. As a result, the EDC and IPF may be considered as an error detection means not necessary to gain access to the buffer RAM in the decode system. It is, therefore, not necessary for the error detection means to improve the performance of the buffer RAM and processing speed of the error correction circuit.

According to the decode system adopting the second algorithm, at least some of the data enables the omission of error correction processing. For this reason, data can be quickly transferred to the host computer. This can constitute a decode system having a high speed access time.

Incidentally, in the case where the reproduction speed of the disk is increased, more advantage is obtained in the adoption of the second algorithm with the user of the EDC and IPF for deciding whether or not to perform error correction processing than in the adoption of the first algorithm which encounters difficulties in improving the processing speed of the error correction circuit. That is, in the case of adopting the second algorithm, the transfer speed of the data is increased and it is not necessary to modify the buffer RAM and error correction circuit. This can prevent an increase in cost.

However, the EDC never takes part in making the error/correction of the data containing an ECC parity (Error Correction Code) added to correct an error in the per-sector data. This is because the ECC parity is not an object for error detection by the EDC.

Further, the IPF is information added under a player's own algorithm and never has any absolute reliability With an improving reproduction speed of the disk, the decision of the error correction necessity from only the EDC and IPF is not adequate to obtain high reliability upon reproduction of the disk.

BRIEF SUMMARY OF THE INVENTION

The present invention, solving the above disadvantages, provides an error detection circuit which can enhance an error detection capability in a decoder adopting an algorithm under which error correction processing is performed on per-sector data sent from a disk player into a decode system only when it is decided through an error detection that there is an error.

The objects of the present invention are achieved by the following devices.

According to one aspect of the present invention, an error detection circuit comprises an ECC error detection circuit supplied with data containing an ECC parity reproduced from a disk and calculating a syndrome for either of at least of P- and Q-correction with use of the data and ECC parity; and a latch circuit for retaining a calculation result.

According to another aspect of the present invention, a decode system comprises a decoder supplied with data containing an ECC parity reproduced from a disk; and a memory connected to the decoder and storing the data containing the ECC parity reproduced from the disk, wherein the decoder has an error detection circuit for calculating a syndrome for either of at least P- and Q-corrections as being supplied with the data containing the ECC parity.

According to another aspect of the present invention a decode system comprises a memory for storing data containing an EEC parity, error detection code (ECC) and interpolation flag (IPP) reproduced from the disk; a first error detection circuit for supplied with the data, the first error detection circuit calculating a syndrome for any of at least P- and Q-corrections with use of data containing the ECC parity; a second error detection circuit supplied with the data, the second error detection circuit detecting the EDC; and a third error detection circuit supplied with the data, the third error detection circuit detecting the IPF.

According to another aspect of the present invention, a decode system comprising: a decoder supplied with data containing an ECC parity reproduced from a disk; and a memory connected to the decoder and storing the data containing the ECC parity reproduced from the disk, the decoder having a calculation circuit for calculating a P correction syndrome and the calculation circuit being supplied with the data and calculating the P correction syndrome when the data is stored in the memory.

According to the present invention, in a decoder adopting an algorithm under which error correction processing is performed only when it is determined through an error correction that there is an error, the detection of the error is made, before the error correction processing, through the utilization of an ECC parity, whereby it is possible to remarkably improve the error detection capability.

According to the present invention, a P-correction syndrome is calculated simultaneously with the writing of data onto a buffer RAM and it is possible to perform the error correction and P-correction at high speeds. Even in the case where the reproduction of the disk is performed at high speeds, the data stored in the buffer RAM can be transferred to a host computer with an adequate allowance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a concept diagram showing a data array having a 1117 data structure;

FIG. 3 is a concept diagram showing a syndrome calculation relating to a Q correction in FIG. 2 in an easy-to-understand way;

FIG. 4 is a concept diagram showing a method for calculating an $S_1$ syndrome relating to a P correction data array in accordance with the error detection circuit of the present invention;

FIGS. 6A and 6B are concept diagrams showing a Q correction data array;

FIG. 7 is a concept diagram showing an $S_1$ syndrome calculation method relating to the Q correction data array in accordance with the error detection circuit of the present invention;

FIG. 9 is a concept diagram showing a data array with the data array of FIG. 6A replaced for convenience in calculation;

BRIEF DESCRIPTION OF THE PREFERRED EMBODIMENT

The embodiments of the present invention will be explained below with reference to the accompanying drawings.

First Embodiment

Figure 1:
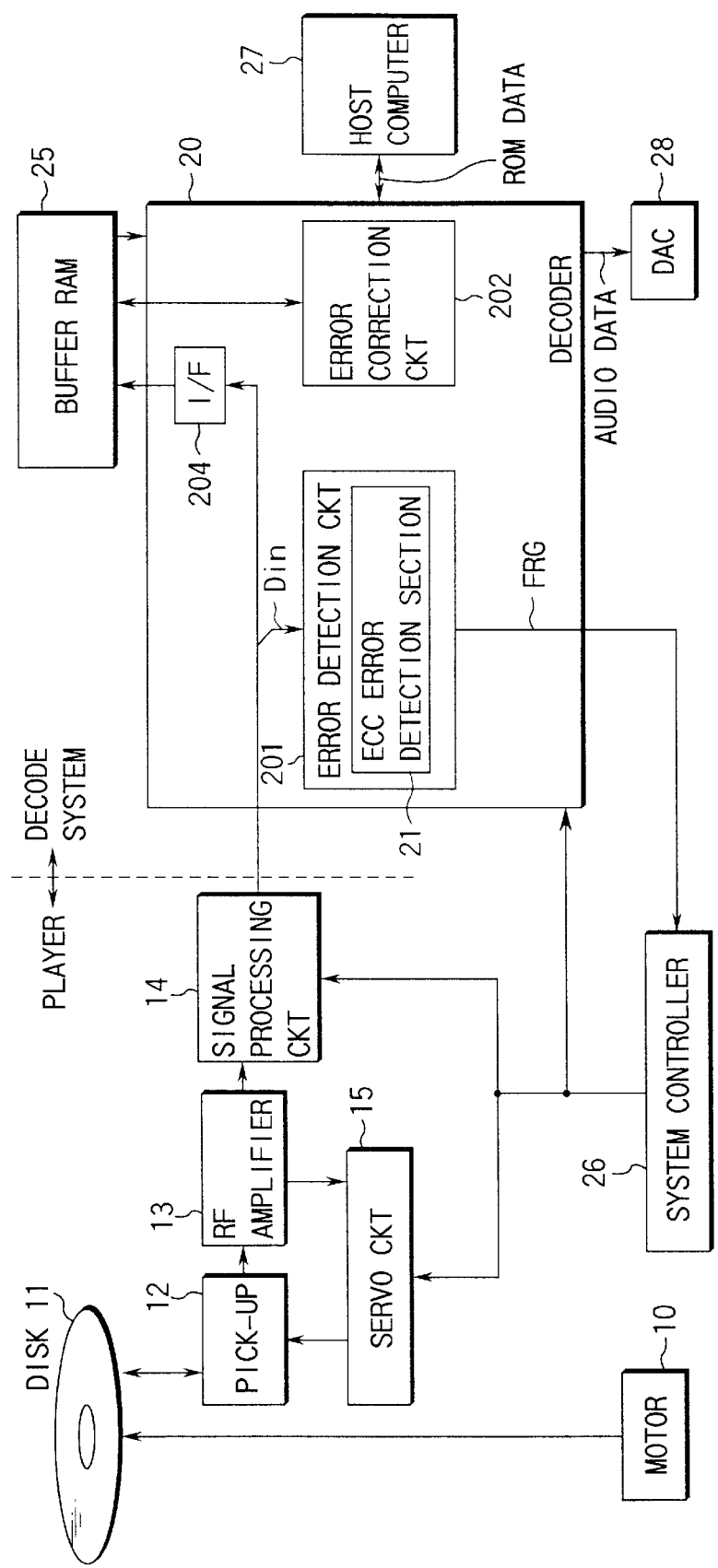
FIG. 1 is a block diagram showing a player for a disk including an error detection circuit according to the present invention and a decode system.

FIG. 1 is an error detection circuit according to a first embodiment of the present invention, showing a player reading out data recorded on a disk and a decode system, including the error detection circuit, for decoding a signal supplied from the player.

A motor 10 rotationally drives a disk 11. A pickup 12 as an optical head directs a laser beam onto a disk 11 and detects reflected light at photodiodes, etc., not shown, and it is converted to an electric signal (high frequency signal: RF signal). An RF amplifier 13 amplifies the RF signal supplied from the pickup 12 and waveform-equalized. The output signal of the RF amplifier 13 is supplied to a pickup-system servo circuit 15 and signal processing circuit 14.

A signal processing circuit 14 includes a data slicer, PLL (phase-locked loop) and synchronizing signal separation circuit and an error correction-system processing circuit, etc., for adding, for example, an IPF to a reproduction signal. A data signal subjected to error correction processing is supplied to a decoder 20 in a decode system.

The decoder 20 has an error detection circuit 201, error correction circuit 202 and interface circuit (I/F) 204 comprised of, for example, a first-in/first-out buffer. To the decoder 20 are connected a buffer RAM 25, system controller 26, host computer 27 and digital/analog converter (DAC) 28.

The data signal supplied from the signal processing circuit 14 to the decoder 20 is supplied to the error detection circuit 201 and it is also temporarily stored in the buffer RAM 25 through the interface circuit 204. The system controller 26 comprised of, for example, a microcomputer controls the servo circuit 15 and signal processing circuit 14 and controls the decoder 20. That is, the system controller 26, starts the error correction circuit 202 in accordance with a result of detection supplied from the error detection circuit 201 if the correction of the data signal is necessary. In the case where the error correction circuit 202 is driven by the system controller 26, access is gained to the buffer RAM and an error data signal is corrected. Then the data signal stored in the buffer RAM is transferred at high speed to the host computer 27. Further, in the case where reproduction is made from the disk with a digital audio signal recorded therein, the data signal stored in the buffer RAM is sent to a digital/analog converter 26 where it is converted to an audio signal.

In the present invention, an algorithm is adopted by which error correction processing is effected only when the error detection circuit 20 decides that an error is contained in the data signal supplied to the decoder 20.

The error detection circuit 201 according to the present invention is comprised of an error detection circuit for detecting an error including an ECC error. That is, it detects an error/correct state of an ECC (Error Correction Codes of P parity and Q parity) which has thus far not been an object for error correction.

That is, the error detection circuit 201 of the present invention has an ECC error detection section 21. The ECC error detection section 21 calculates, from data signal Din containing an ECC parity supplied from a signal processing circuit 14, P- and Q-correction syndromes in the inputting order of the data signals. Before error correction by the error correction circuit 202 the error is thus detected by the ECC error detection section 21 through the utilization of the ECC parity and, by doing so, it is possible to prominently heighten the error detection capability. The technique of the ECC error detection and structure of the error detection circuit 201 will be explained below.

Generally, error correction at the CD-ROM is executed on 2340 bytes ($e_0$ to $e_{2339}$) obtained by subtracting a synchronizing patter 12 bytes from the data (2352 bytes) of one sector. That is, the data of the 2340 bytes ($e_0$ to $e_{2339}$) is separated into two phases: an even-numbered data array ($e_0$, $e_2$, $e_4$, ..., $e_{2338}$) and an odd-numbered data array ($e_1$, $e_3$, $e_5$, ..., $e_{2339}$). The respective phases have 1170 byte data and error correction processing is performed on two phases at the same time. Those syndromes for error correction are similarly calculated on two phases.

The error detection of the present invention, on the other hand, calculates, before the error correction processing, P- and Q-correction syndromes containing an ECC parity in the inputting order of the data. In the actual processing, therefore, the data of 2340 bytes are sequentially processed without the data being separated into two phases as in the error correction in the above-mentioned ordinary CD-ROM.

For convenience in explanation, however, the data is handled as a data array of 1170 bytes. This is because, in the case where these adjacent even- and odd-numbered data (for example, $e_0$ and $e_1$) are separated into two phases, these are located in the same position. For this reason, these data can be handled as a data structure (for example, $d_0$) having the same meaning. Hereinbelow, those adjacent two data will be explained as a single data unit of a 1170 data array.

FIG. 2 shows a concept diagram of the data array having a 1170 data structure. In FIG. 2, four-digit numerals each having one data simply show a number corresponding to the inputting order of data. HEADER, USER DATA and available data area (digital 0) are configured with a data array of Np (=42)×M (=0 to 23).

For such a data array, P- and Q-parities are arranged in a way to be defined by GF ($2^8$) in both P- and Q-sequences' directions, where GF represents a Galois Field. These P- and Q-parities are Reed Solomon codes and, in FIG. 2, the P- and Q-parities are arranged at the bottom of the concept diagram for convenience.

By calculating syndromes with the use of the P- and Q-parities, it is possible to effect error correction of 1 byte of respective data series or detect a two-byte error. In this invention, a design consideration is given to the calculation of the syndromes so that it is utilized for error detection. FIG. 2 shows a calculation direction of the two syndromes of the P- and Q-sequence with respect to the data array.

FIG. 3 is a concept diagram showing a data array where the calculation of syndromes relating to Q correction is represented in an easy-to-understand fashion. The HEADER, USER DATA, available data area (digital 0) and P-parity are configured as a data array of Nq (=0 to 25)×M (=42). The array of the Q parity is arranged adjacent to the data array M (=42) as a $Q_0$ parity and $Q_1$ parity in FIG. 3.

In FIG. 3, the calculation direction of the Q-correction syndromes is set in an M direction (horizontal arrow) as in FIG. 3. The Q-direction syndrome calculation also reaches the P parity array.

The P- and Q-correction syndromes are represented by equations (1), (2), (3) and (4) where u denotes an array field of a predetermined number of input data and α denotes the root of the Galois Field.

$$P \text{ correction } S_0 = u_{25} + u_{24} + \ldots + u_2 + u_1 + u_0 \tag{1}$$

$$S_1 = \alpha^{25} u_{25} + \alpha^{24} u_{24} + \ldots + \alpha^2 u_2 + \alpha^1 u_1 + u_0 \tag{2}$$

$$Q \text{ correction } S_0 = u_{44} + u_{43} + \ldots + u_2 + u_1 + u_0 \tag{3}$$

$$S_1 = \alpha^{44} u_{44} + \alpha^{43} u_{43} + \ldots + \alpha^2 u_2 + \alpha^1 u_1 + u_0 \tag{4}$$

When there is no error in the respective sequence, a result of calculation of this syndrome becomes zero (0). When $S_0$ and $S_1$ of all columns of the respective Q, P (Q: 26 columns, P: 43 columns) all becomes zero (0), it is decided that this sector does not contain any error data through the utilization of this feature. The sums of all arrays of the respective P- and Q-sequences can be calculated by the following equations (5), (6), (7),and (8). It is to be noted that, in these equations, "d" represents input data.

$$P \text{ correction} \sum S_0 = \sum_{i=0}^{1117} d_i \tag{5}$$

$$\sum S_1 = \sum_{i=0}^{1117} \alpha^{25 - (i/43)} d_i \tag{6}$$

$$Q\ correction \sum S_0 = \sum_{i=0}^{1116} d_i \quad (7)$$

$$\sum S_1 = \sum_{i=0}^{25} \left( \sum_{j=0}^{44} \alpha^{44-j} d_j \right) \quad (8)$$

Explanation will be given below about calculating the syndromes relating to the P correction in conjunction with the error correction of the present invention.

The P correction $S_0$ syndrome comprises adding together the data as indicated by the equation (5). Thus, the input data are all sequentially added together.

On the other hand, the P correction $S_1$ syndrome is obtained by calculating the equation (2) in connection with a vertical P sequence of FIG. 2 as shown in equation (6). Therefore, by adding together all of $S_1$ from a 0 to 42 array NP, a sum of the whole of the array is found.

Here, if the $S_1$ can be calculated in the inputting order of the data, a circuit size can be made small and, therefore, a sum of the whole of the array of the $S_1$ can be calculated by the following sequence.

The Galois Field represented by GF ($2^8$) can be represented by the following equation (9) because x(y+z)=xy+xz is satisfied.

$$\begin{aligned}\sum S_1 &= S_1 0 + S_1 1 + S_1 2 + \ldots + S_1 41 + S_1 42 \quad (9)\\ &= \alpha^{25} d_0 + \alpha^{24} d_{43} + \ldots + \alpha d_{1032} + d_{1075} + \alpha^{25} d_1 + \ldots + \\ &\quad \alpha d_{1074} + d_{1117} \\ &= \alpha^{25}(d_0 + d_1 + \ldots + d_{41} + d_{42}) + \\ &\quad \alpha^{24}(d_{43} + d_{44} + \ldots + d_{84} + d_{85}) + \ldots + \\ &\quad \alpha(d_{1032} + \ldots + d_{1074}) + (d_{1075} + \ldots + d_{1117})\end{aligned}$$

The input data is sequentially product-sum calculated through the utilization of the equation above.

FIG. 4 is a concept diagram for calculating the $S_1$ syndrome relating to the P correction data sequence on the error detection circuit of the present invention.

When $(d_0+d_1+\ldots+d_{40}+d_{41}+d_{42})$ as a result of an additive calculation of a top array (zeroth array) is given as $A_0$, this $A_0$ is multiplied by $\alpha$.

$\alpha A_0$

Then when $(d_{43}+d_{44}+\ldots+d_{83}+d_{84}+d_{85})$ as a result of an additive calculation of a second array is given by $A_1$, it is added to the previous calculation results.

$\alpha A_0 + A_1$

This result is again multiplied by $\alpha$.

$\alpha(\alpha+A_1) = \alpha^2 A_0 + \alpha A_1$

Similarly calculated in this way, the following equation is obtained.

$\alpha^{25} A_0 + \alpha^{24} A_1 + \ldots \alpha^2 A_{23} + \alpha A_{24} + A_{25}$ Therefore, an equation (6) is calculated and a sum of all the arrays of the P correction $S_1$ is found.

Figure 5:
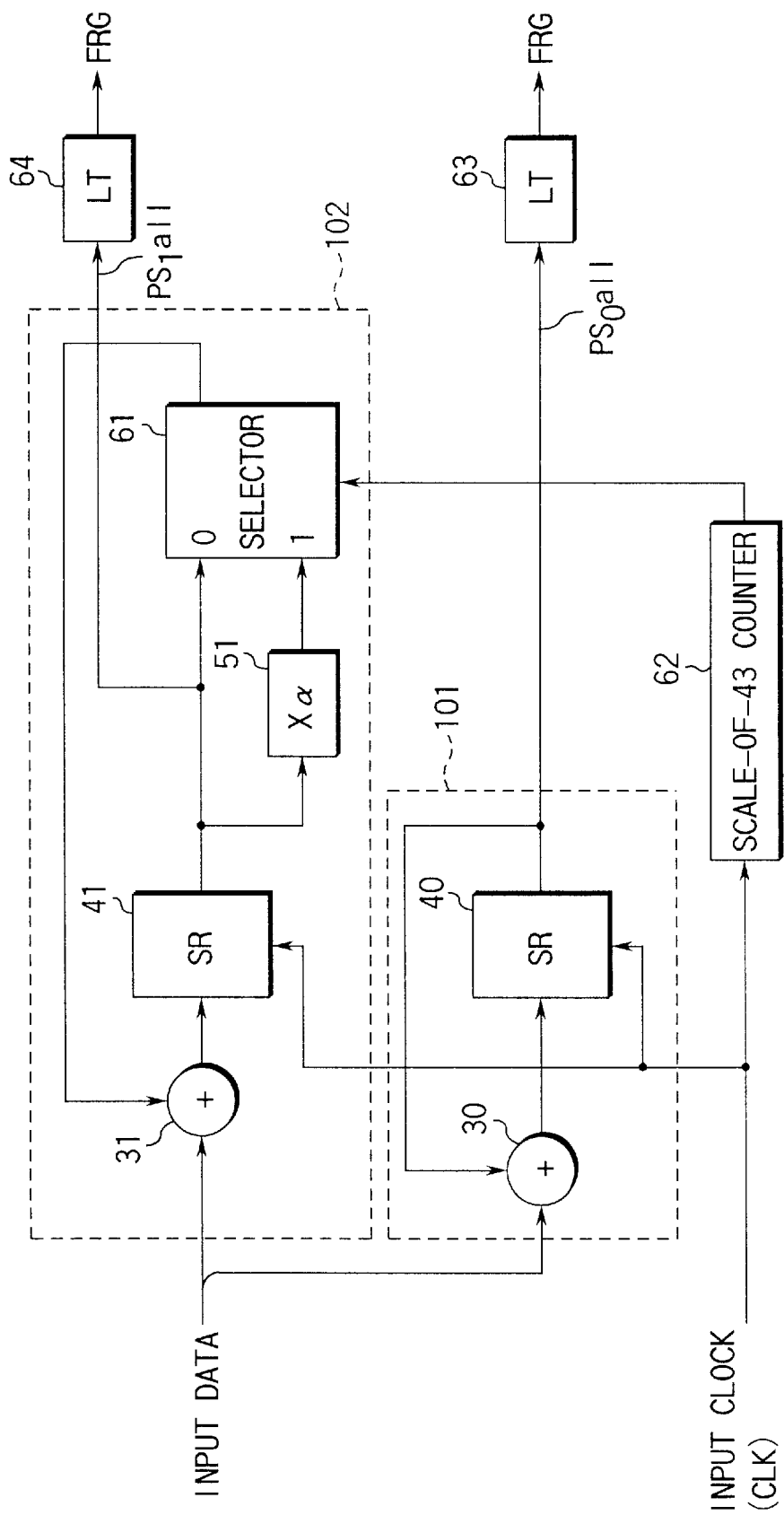
FIG. 5 is a circuit diagram showing a P correction syndrome calculation circuit capable of calculating data in an order of inputting in accordance with the error detection circuit of the present invention.

FIG. 5 is a practical circuit of a portion included in the ECC error detection section 21 in FIG. 1, showing a calculation circuit for the P correction syndrome. This circuit includes a P correction $S_0$ syndrome calculation circuit 101 for calculating a P correction $S_0$ syndrome and a P correction $S_1$ syndrome calculation circuit 102 for calculating a P correction $S_1$ syndrome.

The P correction $S_0$ syndrome calculation circuit 101 comprises an EX-OR (Exclusive OR circuit) 30 as an adder and a shift register (SR) 40 driven in accordance with a clock signal CLK. The calculation of the P correction $S_0$ syndrome is made, as shown in the equation (5), by sequentially adding together the input data. That is, the EX-OR 30 sequentially adds together the input data and output data of the shift register 40. The shift register 40 outputs a calculation result $PS_{0all}$ at a time point at which calculation is made up to the data $d_{1117}$. The calculation result $PS_{0all}$ is retained to a latch circuit (LT) 63.

Further, the calculation of the P correction $S_1$ syndrome is achieved by multiplying the result of calculation at each array by $\alpha$ as shown in the concept diagram shown in FIG. 4. The P correction $S_1$ syndrome calculation circuit 102 comprises an EX-OR 31, shift register 41, multiplier 51, and selector 61. The EX-OR 31 sequentially adds together the input data and output data of the shift register 41. The selector 61 is switchingly controlled by a signal output from a scale-of-43 counter 62. That is, the scale-of-43 counter delivers a high level signal while making 43 counts and, each time the 43 counts have been made, delivers a low level signal. The selector 61 selects a first input terminal 0 by a high level signal from the counter 62 and a second input terminal 1 in accordance with the low level signal. Therefore, the selector 61 selects the output data of the shift register 41, while a high level signal is output from the scale-of-43 counter 62, and supplies it to the EX-OR 31. Further, the selector 61 selects the output data of the multiplier 51 when a low level signal is supplied from the scale-of-43 counter 62. The multiplier 51 multiplies the output data of the shift register 41 by $\alpha$. Therefore, the output data of the shift register 41 is multiplied by $\alpha$ each time 43 counts are made. The data thus multiplied by $\alpha$ is supplied to the EX-OR 31 through the selector 61.

By the above-mentioned arrangement, the additive array is multiplied by $\alpha$ at each count of 43 and, at a time point when the data is added by the EX-OR 31 up to data 1117, shift register 41 delivers a calculation result $PS_{1all}$ of the P correction $S_1$ syndrome. That is, no $\alpha$ multiplication is made with respect to final data array $d_{1075}$ to $d_{1117}$. The calculation result $PS_{1all}$ is retained to a latch circuit (LT) 64.

The clock signal CLK is output from the system controller 26 shown in FIG. 1 for example and supplied to the respective shift registers 40, 41 and scale-of-43 counter 62.

Below explanation will now be given about calculating the syndrome relating to the Q correction in conjunction with the error detection of the present invention.

The sum of all the arrays of the Q correction $S_0$ syndrome comprises an addition of data alone and hence comprises sequentially adding the input data.

On the other hand, the Q correction $S_1$ syndrome is found by calculating an equation (8) with respect to a diagonal data sequence shown in FIG. 2. Here, the following procedure is done so as to sequentially calculate the input data.

Figures 6A, 6B:
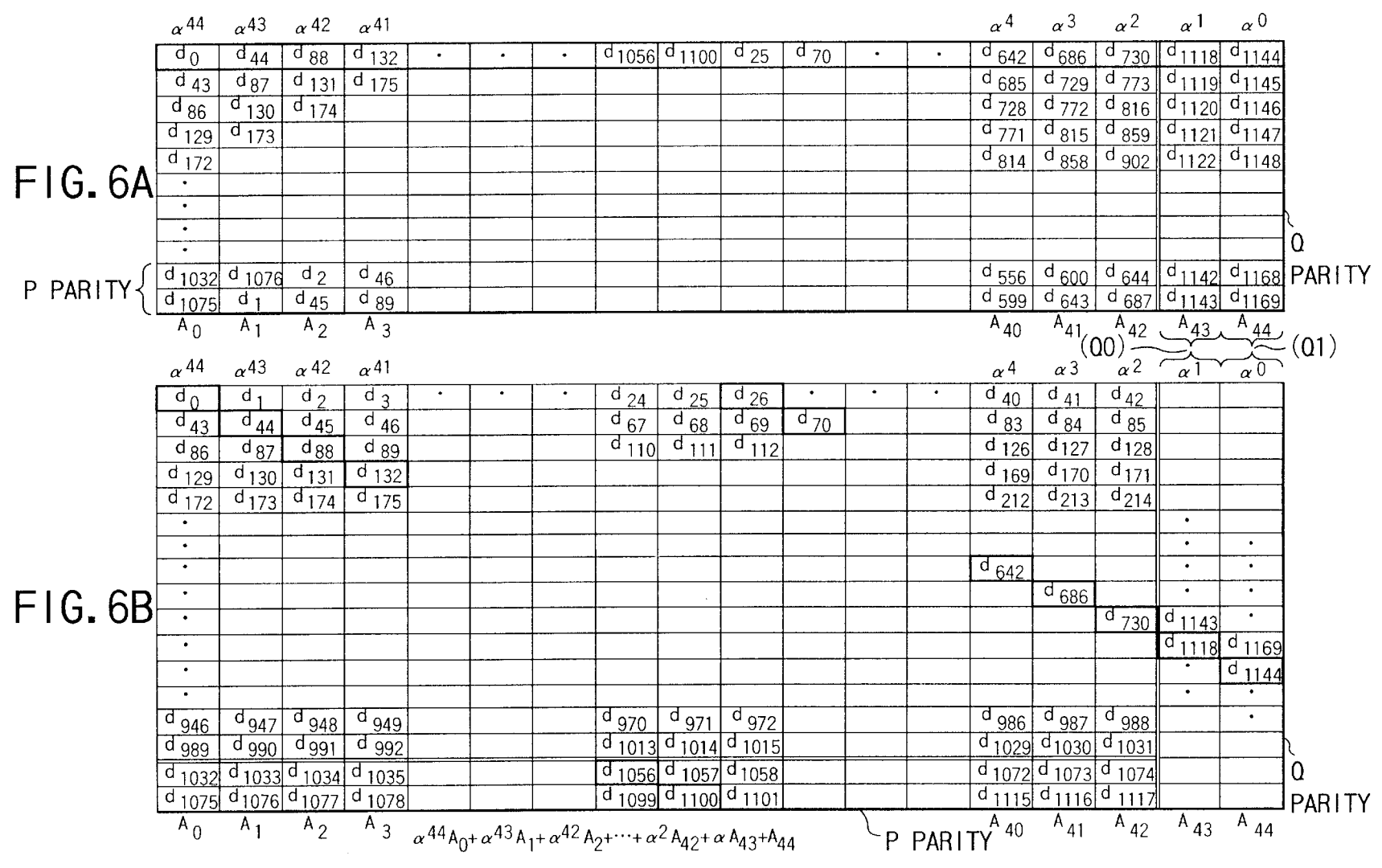

FIGS. 6A, 6B are concept diagrams showing a Q correction data sequence in either case. FIG. 6A shows a data sequence representing the Q correction calculation concept, in an easy-to-understand way, as in FIG. 3, and FIG. 6B represents the same data sequence as in FIG. 2. In these Figures, d denotes input data and a subscript a number of an inputting order of the data. The Q parity code ($Q_0$ parity, $Q_1$ parity) is arranged in a horizontal side of the data as in the case of FIG. 2.

The above-mentioned data sequence is all the arrays of $\alpha^{44}$ in a first position, $\alpha^{43}$ in a second position, $\alpha^{42}$ in a third position ... $\alpha^0$ in a last position. The first data $d_0$ is multiplied by $\alpha$.

$$\alpha d_0$$

The data of the second positions $d_1$ is added to $\alpha d_0$ and again multiplied by $\alpha$.

$$\alpha(\alpha d_0 + d_1) = \alpha^2 d_0 + \alpha d_1$$

Similarly, if calculation is made up to the P parity, the following equation results.

$$\alpha^{42} d_0 + \alpha^{41} d_1 + \alpha^{40} d_2 + \ldots + \alpha^2 d_{40} + \alpha d_{41} + d_{42}$$

In this way, all the array (26 arrays) are calculated and all are added together. In this method, however, it is necessary to latch a calculation result to the sequentially input data at each addition of one array. A design consideration has to be made in the following way.

FIG. 7 shows the Q correction data sequence at the error detection circuit of the present invention, showing a concept diagram for calculating an $S_1$ syndrome in an order of inputting data. Here, the array of the Q parity is not shown for convenience of explanation.

With $\beta_0$ indicating a product-sum calculation result in the first position of the Q sequence and $\beta 1$ a product-sum calculation result in the second position thereof, an equation (10) results.

$$\beta_0 + \beta_1 = \beta_0 + \alpha^{42} d_{43} + \alpha^{41} d_{44} + \ldots + \alpha^2 d_{83} + \alpha d_{84} + d_{85} \quad (10)$$

$$= \alpha^{42} \beta_0 \alpha^{-42} + \alpha^{42} d_{43} + \alpha^{41} d_{44} + \ldots +$$

-continued $$\alpha^2 d_{83} + \alpha d_{84} + d_{85}$$

$$= (\beta_0 \alpha^{-42} + d_{43}) \alpha^{42} + \alpha^{41} d_{44} + \ldots +$$

$$\alpha^2 d_{83} + \alpha d_{84} + d_{85}$$

Each time the product-sum calculation in the first position is carried out, a calculation result is multiplied by $\alpha^{-42}$ and then $(\beta_0 \alpha^{-42} + d_{43}) \alpha^{42}$ results. For this reason, the calculation result can be subjected to product-sum calculation without being latched. If, in this way, a result of the product-sum calculation from the input data $d_0$ to $d_{1117}$ is represented as an X, a result of addition of the $Q_0$ parity is as a Y and a result of addition of the $Q_0$ parity is as a Z, the sum of all the arrays of the Q correction $S_1$ is found from the following equation 11.

$$\alpha^2 X + \alpha Y + Z \quad (11)$$

Figure 8:
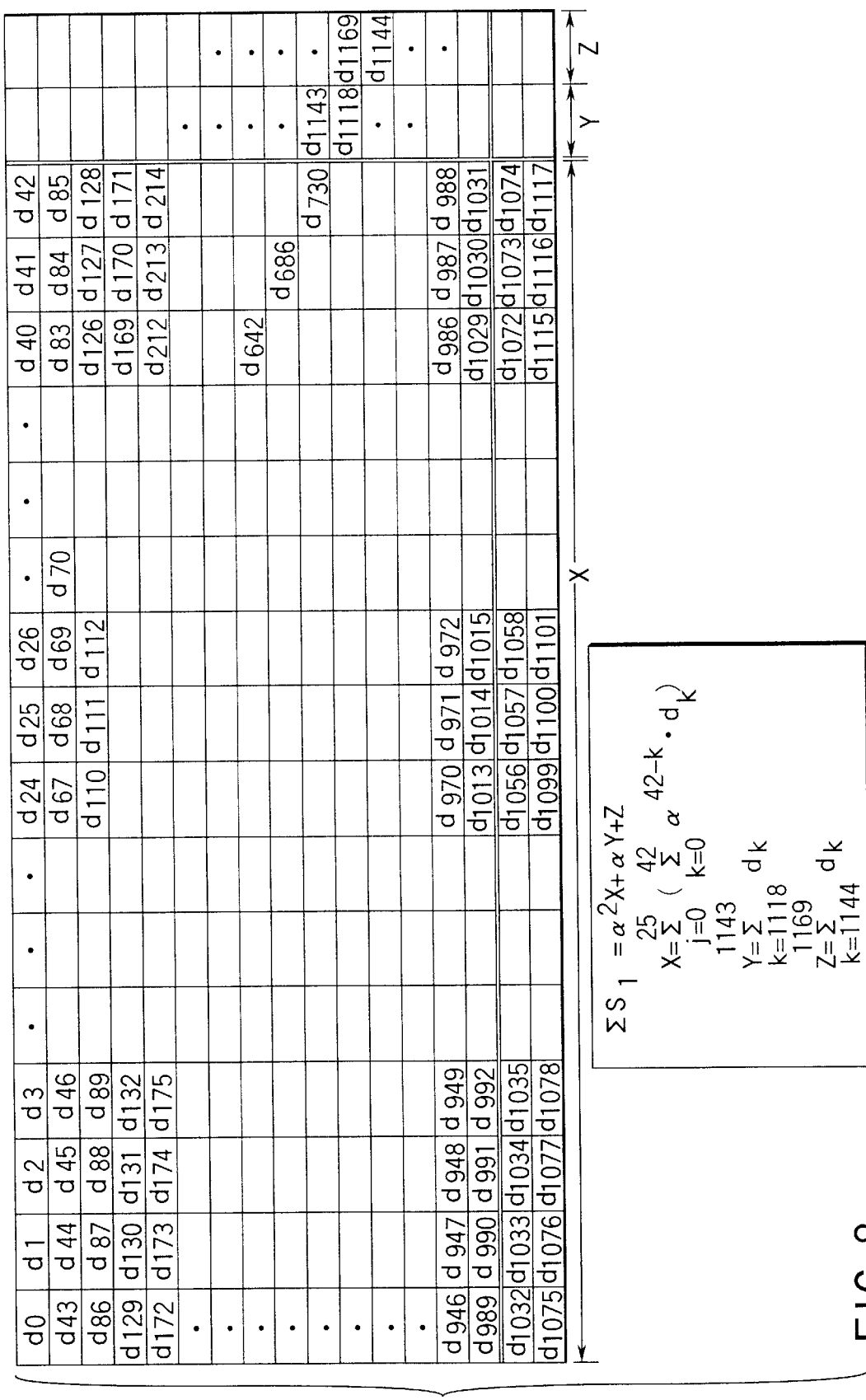
FIG. 8 is a concept diagram showing an $S_1$ syndrome calculation method relating to the Q correction data array in accordance with the error detection circuit of the present invention.

FIG. 8 shows a Q correction data array in the error detection circuit of the present invention, providing a concept diagram for calculating the $S_1$ syndrome in an inputting order of the data. The data array ($d_{1118}$ to $d_{1169}$) of the Q parity are reflected on the array of the Q correction calculation direction shown in FIG. 3.

FIG. 9 shows a data array with the data array of FIG. 6A replaced for convenience in calculation so as to prove that the equation (11) above is equivalent to the equation (8). With reference to the data array shown in FIG. 9, the equations (11) and (8) are expanded for inspection.

$$\sum_{i=0}^{25} \left( \sum_{j=0}^{44} \alpha^{44-j} \cdot A_j \right) \leftarrow \text{(a product-sum form in brackets is expanded.)} \quad (8)$$

$$\sum_{i=0}^{25} (\alpha^{44} A_0 + \alpha^{43} A_1 + \ldots + \alpha^2 A_{42} + \alpha A_{43} + A_{44}) \leftarrow \left( \begin{array}{c} \text{An expansion is made for } i \text{ with} \\ \text{the use of } \left( A_j = \sum_{i=0}^{25} a_{25i} \right) (A_j = A_0 \text{ to } A_{44}) \end{array} \right) = \quad (12)$$

$$\alpha^{44}(a_0 + a_{45} + a_{90} + \ldots + a_{1080} + a_{1125}) + \alpha^{43}(a_1 + a_{46} + \ldots + a_{1126}) +$$

$$\ldots + \alpha(a_{43} + a_{88} + \ldots + a_{1168}) + (a_{44} + a_{89} + \ldots + a_{1169})$$

$$S_1 = \alpha^2 X + \alpha Y + Z = \alpha^2 \left\{ \sum_{i=0}^{25} \left( \sum_{j=0}^{42} \alpha^{42-j} \cdot A_j \right) \right\} + \alpha \sum_{k=0}^{25} a_{43+45k} + \sum_{l=0}^{25} a_{44+45l} \quad (13)$$

↑ (When $d_i$ is transformed to $a_i$, the equation if FIG. 8 is expressed like this.)

$$= \alpha^2 \left\{ \sum_{i=0}^{25} (\alpha^{42} A_0 + \alpha^{41} A_1 + \ldots + \alpha^2 A_{40} + \alpha A_{41} + A_{42}) \right\} + \alpha(a_{43} + a_{88} + \ldots + a_{1168}) + (a_{44} + a_{89} + \ldots + a_{1169})$$

↑ (An expansion is made for $i$ with the use of $\left( A_j = \sum_{i=0}^{25} a_{45i} \right)$)

$$= \alpha^2 \{\alpha^{42}(a_0 + a_{45} + a_{90} + \ldots + a_{1080} + a_{1125}) + \alpha^{41}(a_1 + a_{46} + \ldots + a_{1126}) + \ldots + (a_{42} + a_{87} + \ldots + a_{1167})\} +$$

$$\alpha(a_{43} + a_{88} + \ldots + a_{1168}) + (a_{44} + a_{89} + \ldots + a_{1169})$$

$$= \alpha^{44}(a_0 + a_{45} + a_{90} + \ldots + a_{1080} + a_{1125}) + \alpha^{43}(a_1 + a_{46} + \ldots + a_{1126}) + \ldots + \alpha^2(a_{42} + a_{87} + \ldots + a_{1167}) +$$

$$\alpha(a_{43} + a_{88} + \ldots + a_{1168}) + (a_{44} + a_{89} + \ldots + a_{1169})$$

The equation (12) is equal to the equation (13).
*For the signs A, a in the equations above, see FIG. 9.

It is found that the equations (12) and (13) are equal to each other. In equations (12) and (13), for symbols A and a, reference is made to FIG. 9.

Figure 10:
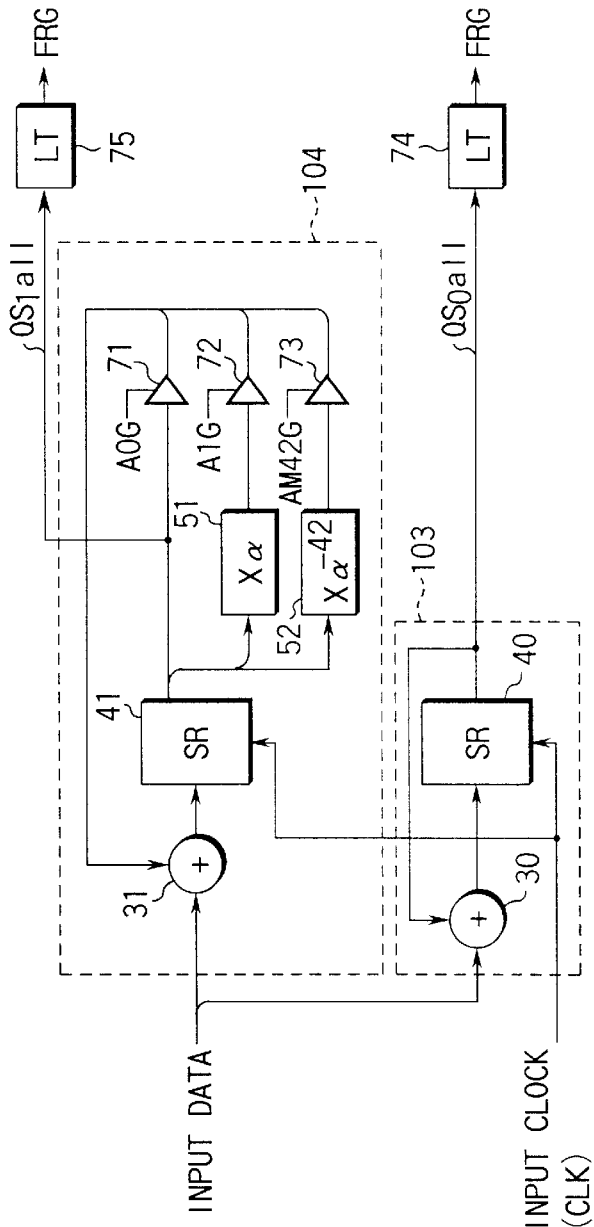
FIG. 10 is a circuit diagram showing a Q correction syndrome calculation circuit capable of calculating data in an order of data inputting in the error correction circuit of the present invention.

FIG. 10 shows one practical circuit for calculating the Q correction syndrome calculation circuit in the ECC error detection section 21 shown in FIG. 1. This circuit includes a Q correction $S_0$ syndrome calculation circuit 103 for calculating the $S_0$ syndrome for Q correction and a Q correction $S_1$ syndrome calculation circuit 104 for calculating the $S_1$ syndrome for Q correction.

The Q correction $S_0$ syndrome calculation circuit 103 comprises an EX-OR (exclusive OR circuit) 30 and a shift register (SR) 40 driven in accordance with a clock signal CLK. The Q correction $S_0$ syndrome calculation comprises sequentially adding all input data. That is, the EX-OR 30 sequentially adds the input data and output data of the shift register 40. The shift register 40 outputs a calculation result $QS_{0all}$ at a point in time when an additive calculation is made up to data $_{1169}$. This calculation result $QS_{0all}$ is retained to a latch (LT) circuit 74.

Further, the Q correction $S_1$ syndrome calculation comprises, as shown in the concept diagram in FIG. 7, effecting a multiplication by $\alpha$ at each addition of the input data and effecting a multiplication by $\alpha^{-42}$ each time the final data (43-th data) of the respective input array is added. This calculation is made on $d_{1032}$ to $d_{1117}$ at the P parity array. It is to be noted that, after the final data $d_{1117}$ of the P parity is additively calculated, an addition result is not multiplied by a $\alpha^{-42}$.

Thereafter, $Q^0$ parity code arrays are sequentially added to a result of the above addition and the result obtained is multiplied by $\alpha$. Further, $Q^1$ parity code arrays are added to the result of the addition (see the equation (11)).

In order to perform the above-mentioned calculation, the Q correction $S_1$ syndrome calculation circuit 104 has, as shown in FIG. 10, an EX-OR 31 as an adder, a shift register (SR) 41, multipliers 51, 52 and tristate buffers 71, 72 and 73 as transfer gates. The EX-OR 31 adds together the input data and data output from any of the tristate buffers 71, 72, 73. The output signal of the EX-OR 31 is supplied to the multipliers 51, 52 and tristate buffer 71 through the shift register 41 controlled by a clock signal CLK. The tristate buffer 71 supplies the output data of the shift register 41 in accordance with a signal AOG, the tristate buffer 72 supplies the output data of the multiplier 51 to the EX-OR 31 in accordance with a signal AIG and the tristate buffer 73 supplies the output data of the multiplier 52 to the EX-OR 31 in accordance with a signal AM42G.

Figure 11:
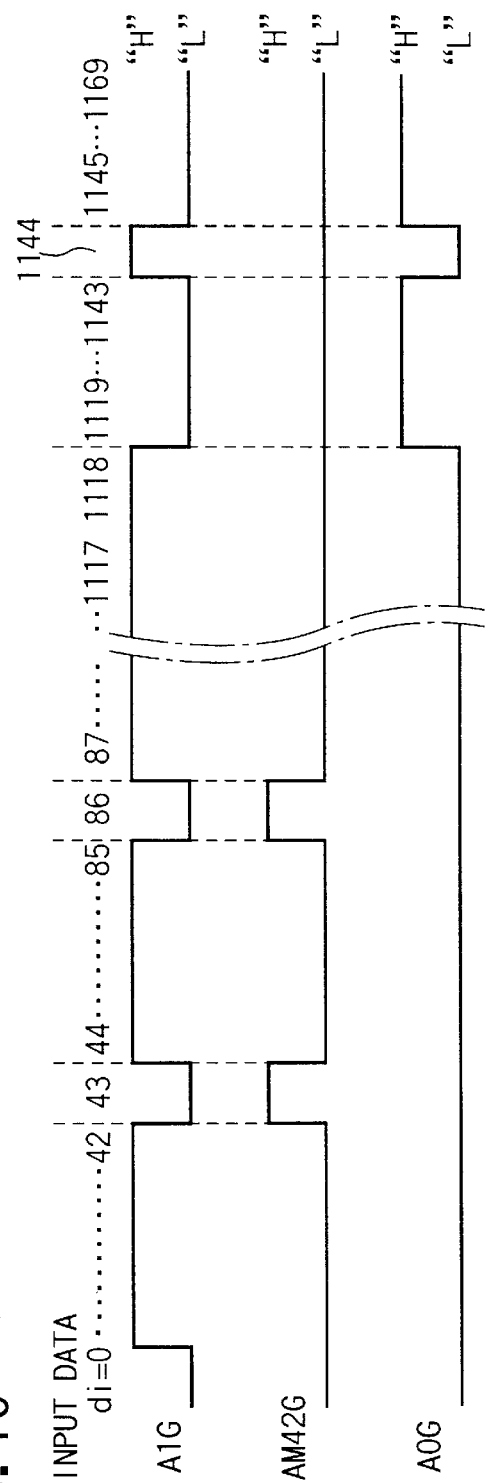
FIG. 11 is a circuit diagram showing a control signal of a tristate buffer in FIG. 10.

FIG. 11 shows the timing waveforms of the signals A0G, A1G and AM42G controlling the tristate buffers 71, 72 and 73. That is, the signals AIG, AM42G and AOG are made at an active level ("H" level) in accordance with the progress state of calculation and sequentially turn the tristate buffers 72, 73 and 71 ON. With the tristate buffers 72, 73 and 71 ON, the output data of the multiplier 51, output data of the multiplier 52 and output data of the shift register 41 are sequentially selected. The respective signals A0G, A1G, AM42G are generated under the system controller 26 as shown, for example, in FIG. 1.

The multiplier 51 sequentially multiplies 42 data output from the shift register (SR) 41 by $\alpha$. An addition result of the $Q^0$ parity code array is multiplied by $\alpha$. The output data of the multiplier 51 is supplied to the EX-OR 31 through the tristate buffer 72.

The multiplier 52 multiplies, by $\alpha^{-42}$, the data to which is added a final data (43-th data) of the respective input data array output from the shift register 41. The output data of the multiplier 52 is supplied to the EX-OR 31 through the tristate buffer 73. The multiplier 52 never multiplies an addition result data by $\alpha^{-42}$ after the addition of a final data $d_{1117}$ of the P parity.

When the signal AOG is at an active level ("H" level), the tristate buffer 71 supplies, to the EX-OR 31, the data to which are added the data $d_{1118}$ to $d_{1169}$ of the Q parity outputted from the shift register 41.

In this way, at a point in time when addition is made up to the data $d_{1169}$, a calculation result output $QS_{1all}$ from the shift register 41 is retained to a latch circuit 75.

Figure 12:
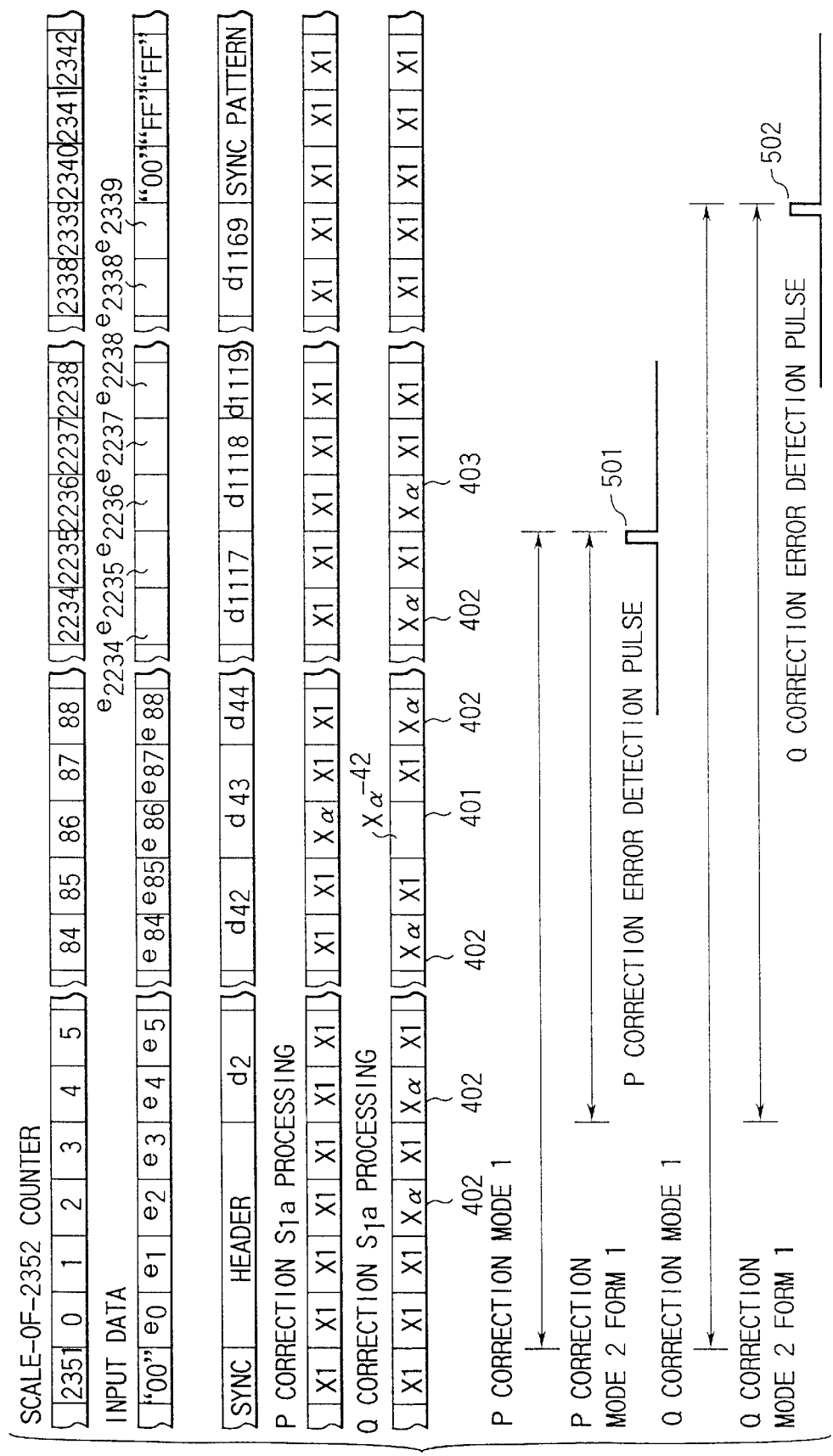
FIG. 12 is a timing chart showing an error decision algorithm to which an error detection circuit of the present invention is applied.
Figure 13:
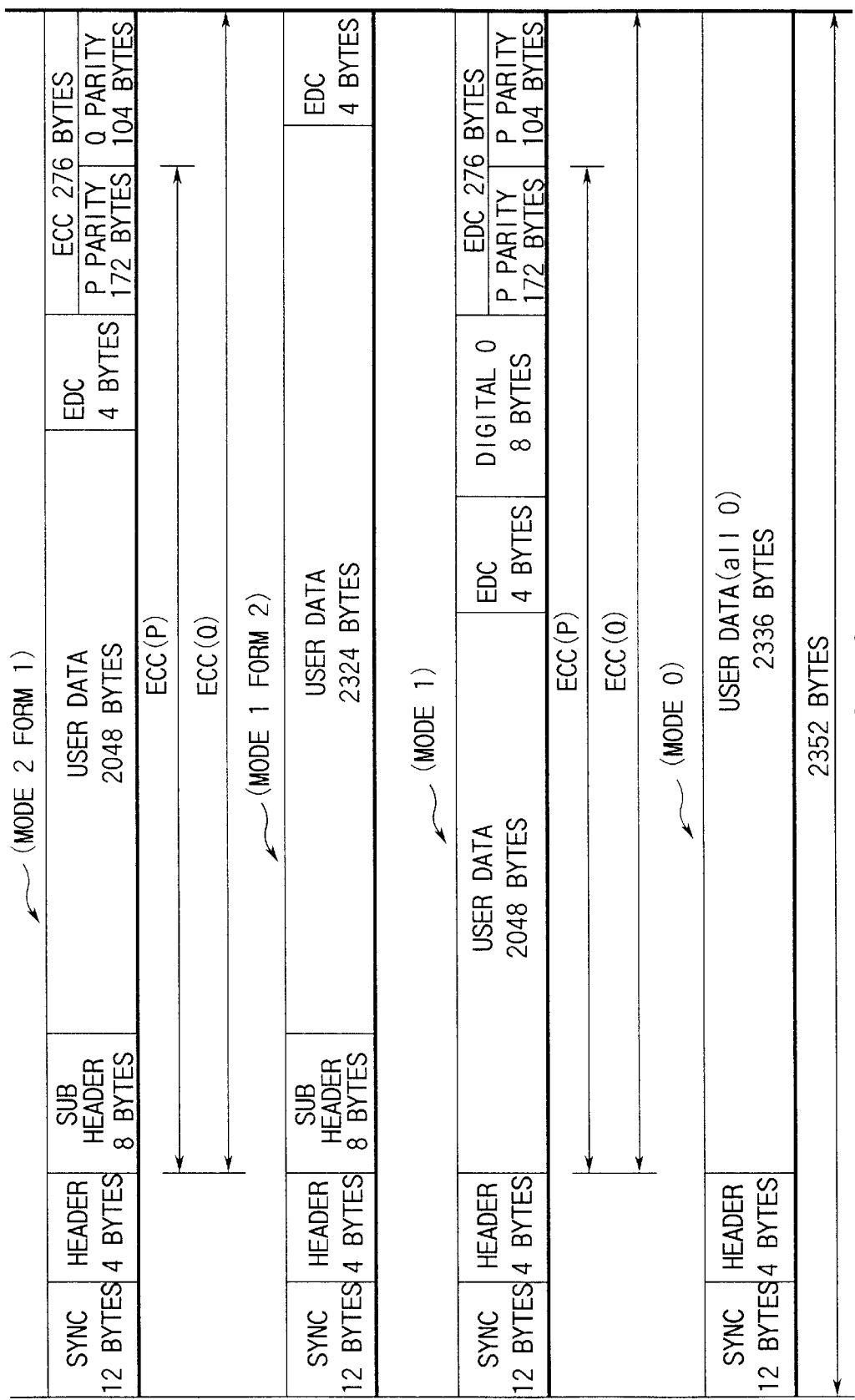
FIG. 13 is a view showing a disk format to which an error detection algorithm of the present invention is applied.

FIG. 12 shows a timing chart of an error decision algorithm to which the error detection circuit of the present invention is applied. FIG. 13 shows CD-ROM formats classified by type, showing a data configuration of one sector.

The formats of the CD-ROM will be explained below with reference to FIG. 13. The formats of the CD-ROM are from MODE0 to MODE2. Those formats with a correction code attached are MODE1 and MODE2 FORM1. The above-mentioned first embodiment is based on MODE1 but it is necessary to handle a situation under MODE2 FORM1.

The MODE2 FORM1 shown in FIG. 13 is so configured as to be set out below. A SYNC of 12 bytes is an area representing a head of a block, noting that, in FIG. 12, it is also indicated as a SYNC pattern. 4-Byte HEADER and 8-byte SUB HEADER are data areas having position and mode form information. A 2048-byte USER DATA is an area where the user information is recorded. The error detection code EDC is 4-bytes long and an error correction code ECC area is 278 bytes long. The ECC area is separated into a 172-byte P parity and 104-byte Q parity.

In FIG. 13, ECC (P) and ECC (Q) of arrow-indicated ranges in MODE1 and MODE2 FORM1, respectively, are a target range for P correction syndrome calculation and that for Q correction syndrome calculation. As evident from this, the present invention can evaluate an error/correct state of data containing an ECC parity not as an error detection target under the above-mentioned second algorithm (the algorithm by which the error correction processing is performed only when it is decided that an error is contained at an error detection).

Next, the contents of FIG. 12 will be explained below with reference to FIG. 13. In FIG. 12, the number represented by a scale-of-2352 counter shows a count number corresponding to one sector (2352 bytes) of input data. The input data constitutes, in actuality, a data configuration "d" in which one meaning is given by 2 bytes of those adjacent even- and odd-numbered input data. For this reason, for example, $d_0$ is represented by a sum of $e_0$ (one byte) and $e_1$ (one byte). Therefore, $d_1$ is represented by a sum of $e_2$ and $e_3$, $d_2$ a sum of $e_4$ and $e_5$, . . . , $d_{1169}$ a sum of $e_{2338}$ and $e_{2339}$. Here, the four bytes of $d_0$ and $d_1$, that is, $e_0$ to $e_3$, constitute a HEADER containing position and MODE FORM information (see FIG. 13).

A pattern indicated by "00 FF FF FF FF FF FF FF FF FF FF 00" (scale-of-16) of the SYNC showing the head of the block is fixed data representing the head of the sector. This fixed pattern is used for, for example, a decoder or a control-system's internal counter of the system controller to detect and clear the SYNC. A scale-of-2352 counter in the decoder also detects and clears the SYNC data. The above-mentioned SYNC pattern, such as "00 . . . FF . . . 00" above is 12-bytes long (see FIG. 13).

[P correction $S_1\alpha$ processing] in FIG. 12 shows a timing of "multiply by $\alpha$" in the calculation of a P correction $S_1$ syndrome. That is, a code 300 shows a timing in which, at each 43 counts, an addition result of the sequentially input data $d_i$ as explained in FIGS. 4 and 5 is multiplied by $\alpha$. Namely, the code 300 shows that, after the addition of the data $d_{42}$, the addition result is multiplied by $\alpha$ by the multiplier 51 in FIG. 5. The input data of other timing is multiplied by 1 (×1).

[Q correction $S_1\alpha$ processing] in FIG. 12 shows a timing in which input data arrays are multiplied by $\alpha$ or $\alpha^{-42}$. That is, the codes 401, 402 show an operation timing in which, as shown in FIGS. 8, 10 and 11, a calculation result of the input data $d_i$ is multiplied by $\alpha$ or $\alpha^{-42}$. Namely, the code 402 shows a timing in which, at each addition of the input data $d_i$, "multiply by $\alpha$" calculation is effected at the multiplier 51 in FIG. 10 and the code 401 shows a timing in which, at each 43 counts, an addition result of the input data $d_i$ is multiplied by $\alpha^{-42}$. Such calculation is performed up to the P parity array $d_{1032}$ to $d_{1117}$. It is to be noted that, after the addition of the final data $d_{1117}$ in the P parity, the addition result data is not multiplied by $\alpha^{-42}$ but is multiplied by $\alpha$ by the multiplier 51 in the timing shown in the code 403.

Thereafter, though not shown in FIG. 12, an addition result of the $Q_0$ parity code array is multiplied by $\alpha$ by the multiplier 51 and it is added to a calculation result of the data array $d_0$ to $d_{1117}$ and an addition result of the $Q_1$ parity code array is added.

[P correction model] in FIG. 12 shows a P correction syndrome calculation period (shown by arrows) in a MODE1 format mode. Further, [P correction mode 2 form 1] shows a P correction syndrome calculation period (shown by arrows) in the format mode of the MODE2 FORM1. [Q correction mode 1] shows a Q correction syndrome calculation period (shown by arrows) in the format mode of the MODE1. Further, [Q correction mode 2 form 1] shows a Q correction syndrome calculation period (shown by arrows) in a format mode of the MODE2 FORM1.

That is, the ECC application range of the MODE1 is 2340 bytes including the HEADER and that of the MODE2 FORM1 is 2336 bytes excluding the HEADER. Since a difference between the MODE1 and the MODE2 FORM1 is whether or not the HEADER is included, a calculation result of the HEADER section alone is conserved and, by taking a logical sum of the calculation result of the MODE1 and conserved calculation result of the HEADER section, it is possible to check the MODE2 FORM1 for an error.

Even in the format mode of any of the MODE1 and MODE2 FORM1, a P correction error detection pulse and Q correction error detection pulses 601, 602 are output at a point in time when their respective calculation periods are terminated.

In accordance with the P correction error detection pulse 501, the calculation results $PS_{0all}$ and $PS_{1all}$ of the calculation circuits 101 and 102 are retained to the latch circuits 63 and 64. Further, in accordance with the Q correction error detection pulse 502, the calculation results $QS_{0all}$ and $QS_{1all}$ of the calculation circuits 103 and 104 in FIG. 10 are retained to the latch circuits 74 and 75.

As set out above, the detection signal FRG retained in the error detection circuit 201 shown in FIG. 1 is supplied to the system controller 26 upon request from the system controller 26. The system controller 26 decides whether or not an error correction is started and does so by the error correction circuit 202 in the decoder 20 in accordance with the detection signal FRG. And a control signal corresponding to the decision is supplied to the decoder 20. If, therefore, there is no error, error correction processing is not performed and the data stored in the buffer RAM is transferred to the host computer 27.

According to the first embodiment, the ECC error detection section 21 sequentially receives per-sector data with an ECC parity attached thereto which is supplied from the disk player, and error detection is made through the calculation of the syndrome including the ECC parity. It is, therefore, possible to greatly improve error detection accuracy.

If it is decided by a detection result output from the error detection circuit 201 that there is no error, the error correction circuit 202 never effects error correction. Therefore, the data stored in the buffer RAM25 can be transferred at high speeds to the host computer 27.

Further, even if an inexpensive, slow operation speed RAM is used as the buffer RAM25, it can achieve a high-speed disk reproduction and high-speed host transfer. Since error correction processing is performed on only data requiring correction instead of all the data involved, it is possible to reduce a whole data transfer speed. Even if the reproduction speed of the disk is increased to some extent, it is not necessary to improve the performance of the buffer RAM and it is also not necessary to change the circuit sizes of the RAM. For this reason, a resultant circuit can be manufactured at low cost.

The data is supplied to the ECC error detection section 21 not via an interface circuit. To the buffer RAM 25 the data is supplied via the interface circuit 204. The data calculation speed of the ECC error detection section 21 is faster than that at which the data is written in the buffer RAM 25. However, an input path of the ECC error detection section 21 is set to be shorter than that of the buffer RAM 25. Therefore, the data is supplied faster to the ECC error detection section 21 than to the buffer RAM 25. Therefore, the error detection can be carried out at high speeds and it is possible to perform a positive operation.

Further, the ECC error detection of the present invention provides a different detection method in comparison with the conventional algorithm such as the EDC (error detection code) and IPF (for example, a flag for C2 correction, a C2 correction failure flag, correction flag, etc.). For this reason, it is possible to obtain a very high error detection capability in combination with these error detection methods. Such a combination use will be explained below.

Second Embodiment

Figure 14:
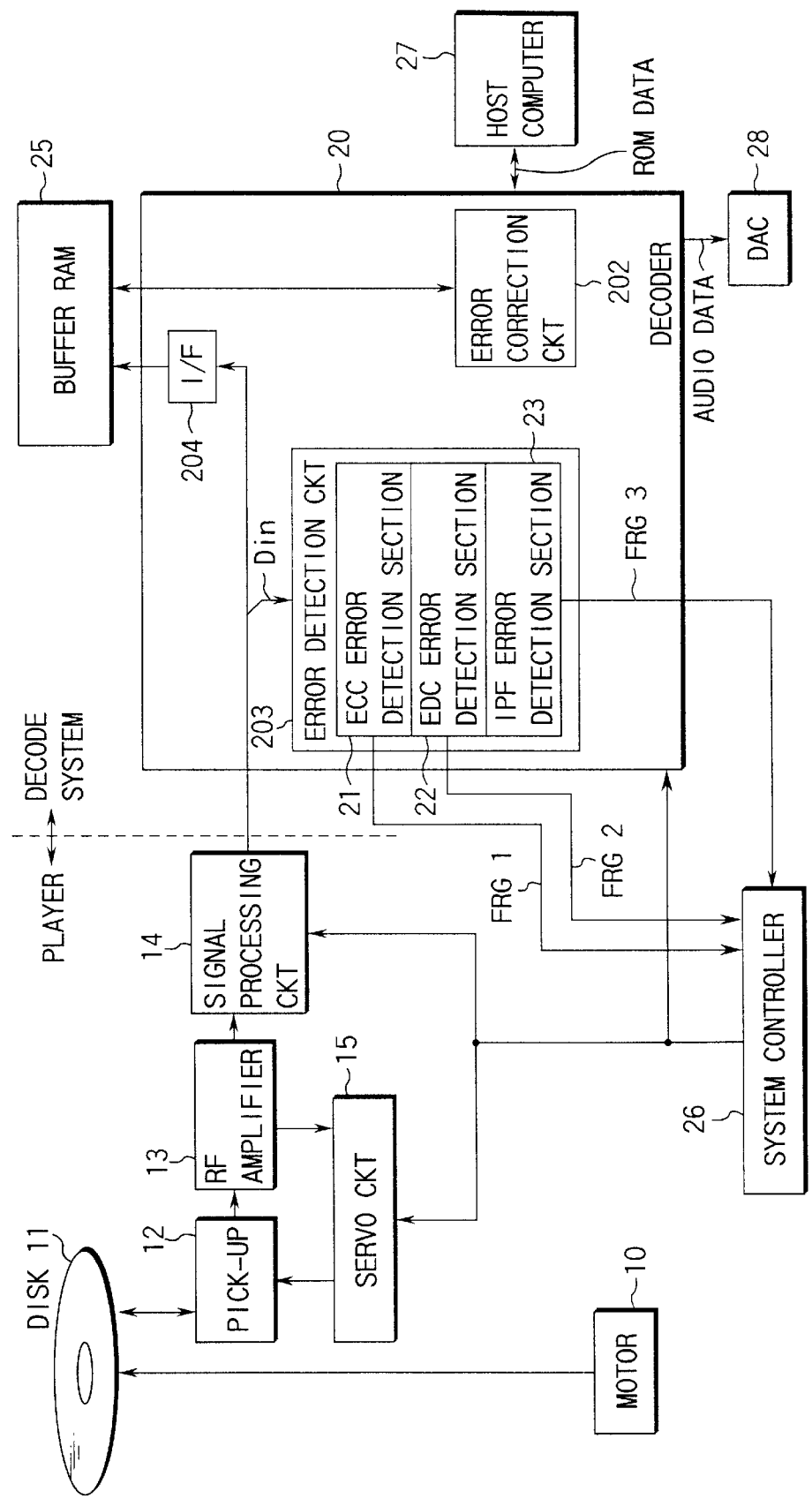
FIG. 14 is a block diagram showing a player for a disk including an error detection circuit according to a second embodiment of the present invention.

FIG. 14 shows an error detection circuit according to a second embodiment of the present invention, showing a player for reading out data recorded in a disk and a decode system including the above-mentioned error detection circuit for decoding a signal supplied from the player. In FIG. 14, the same reference numerals are employed to designate parts or elements corresponding to those shown in FIG. 1 and any further explanation is, therefore, omitted.

In FIG. 14, the error detection circuit 203 further includes an EDC error detection section 22 and IPF error detection section 23 comprised of, for example, a counter. The EDC error detection section 22 detects an EDC (Error Detection Code) in data which is output from a signal processing circuit 14. That is, the EDC error detection section 22 detects whether or not there is an error and does so through the calculation of the following polynomial (14).

$$P(x)=(x^{16}+x^{15}+x^2+1)(x^{16}+x^2+x+1) \qquad (14)$$

The EDC error detection section 22 delivers a detection signal FRG2 as a detection result.

In the case where an error is detected during signal processing by the signal processing circuit 14, the IPF error detection section 23 detects an IPF (for example, a flag for C2 correction, C2 correction failure flag, correction flag, etc.) attached to the data by the signal processing circuit 14. This IPF is attached as one bit to the data of, for example, one byte. And the IPF error detection section 23 decides no error in the case where a count value is "0" at a counting of the number of IPFs in one sector. The IPF error detection section 23 outputs a detection signal FRG3 as a detection result.

These detection signals FRG2, FRG3 and detection signal FRG1 of the ECC error detection section 21 are supplied to a system controller 26 in accordance with a request of the system controller 26. The system controller 26 decides whether or not an error correction is necessary and does so by these detection signals FRG1, FRG2, FRG3. If correction is necessary, an error correction circuit 202 in the decoder 20 is driven. Further, if the error correction is not necessary, the error correction processing is not performed. The system controller instructs the decoder 20 to allow the data, to be transferred from the buffer RAM 25 to a host computer 27.

Even in the above-mentioned second embodiment it is possible to obtain the same advantage as in the first embodiment. Further, in accordance with the second embodiment, in addition to the ECC error detection, the EDC and IPF are also detected and the system controller 26 enables an error to be detected based on the three detection signals FRG1 to FRG3. Therefore, it is possible to further improve the accuracy with which the error is detected.

Although, in the above-mentioned first and second embodiments, the P and Q correction syndrome calculations are carried out at the error detection, the present invention can also be applied to the calculation of the P or the Q correction syndrome.

Third Embodiment

The third embodiment of the present invention will be explained below.

In the conventional CD-ROM decode system, data from a CD player is written in a buffer RAM, the data stored in the buffer RAM is subjected to error correction and a result is transferred to a host computer. For this reason, the buffer RAM has two areas (hereinafter referred to as the phases) selectively used to allow the writing of the data and error correction to be simultaneously done.

Figure 15:
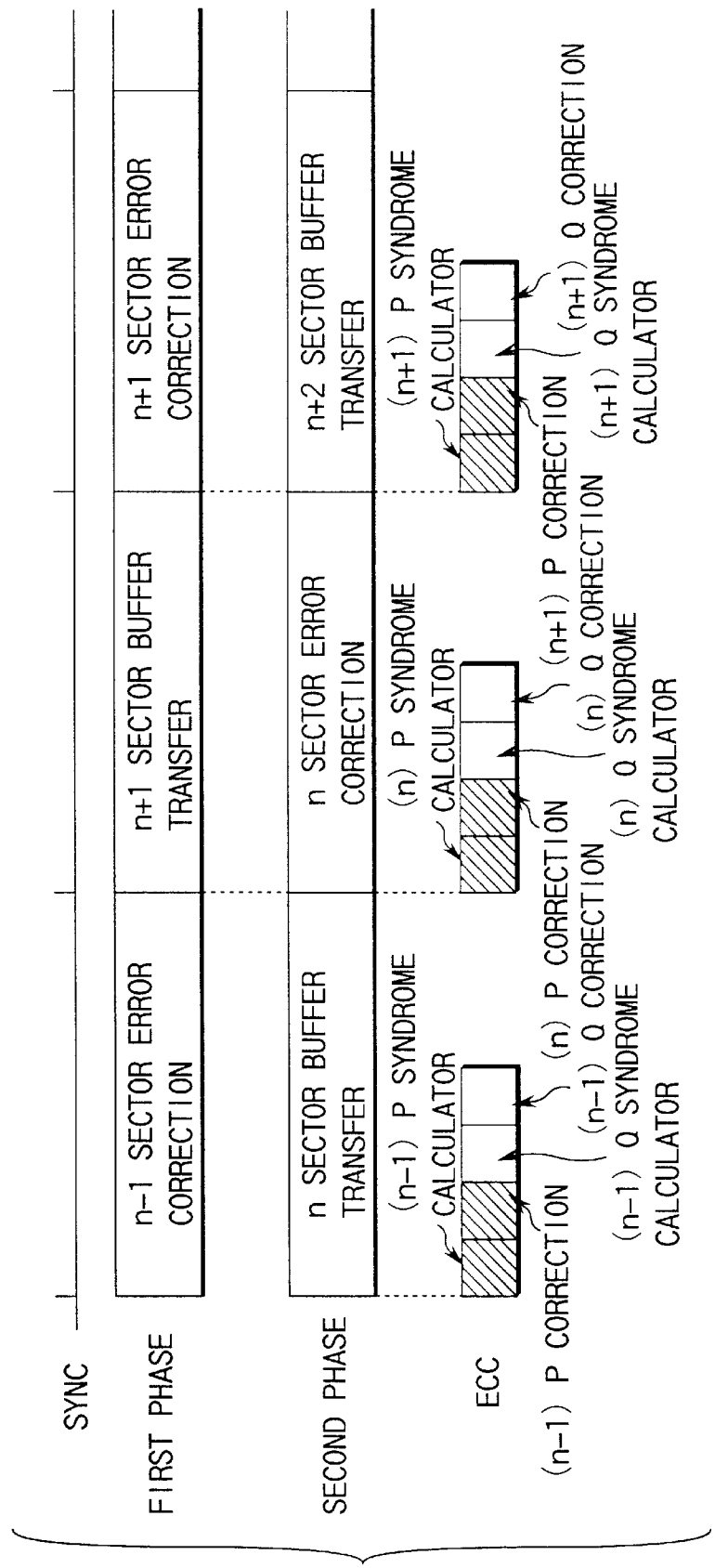
FIG. 15 is a view showing an operation of a conventional decoder.

As shown in FIG. 15, for example, when the error correction of an n−1 sector is effected at a first phase, the buffer transfer of the n sector is effected at a second phase. When data of the next sector is input, at the first phase involving the error correction the buffer transfer of an n+1 sector is performed, while an error correction of an n sector is performed at the second phase. In this system, unless the error correction of the n sector is all completed during the buffer transfer of, for example, the n+1 sector, the data of an n+2 sector will destroy the data of the n sector. Recently, optical disks are rotated at high speed, and data is input at proportionally high rate. The buffer transfer of the sector, shown in FIG. 15, must therefore be achieved within a very short time. To this end, the time for error correction should be shortened. In the error correction, the following three processes are required for the P and Q sequences.

① The calculation of the syndrome;

② The calculation of the error location; and

③ The correction of the error data.

Figure 16:
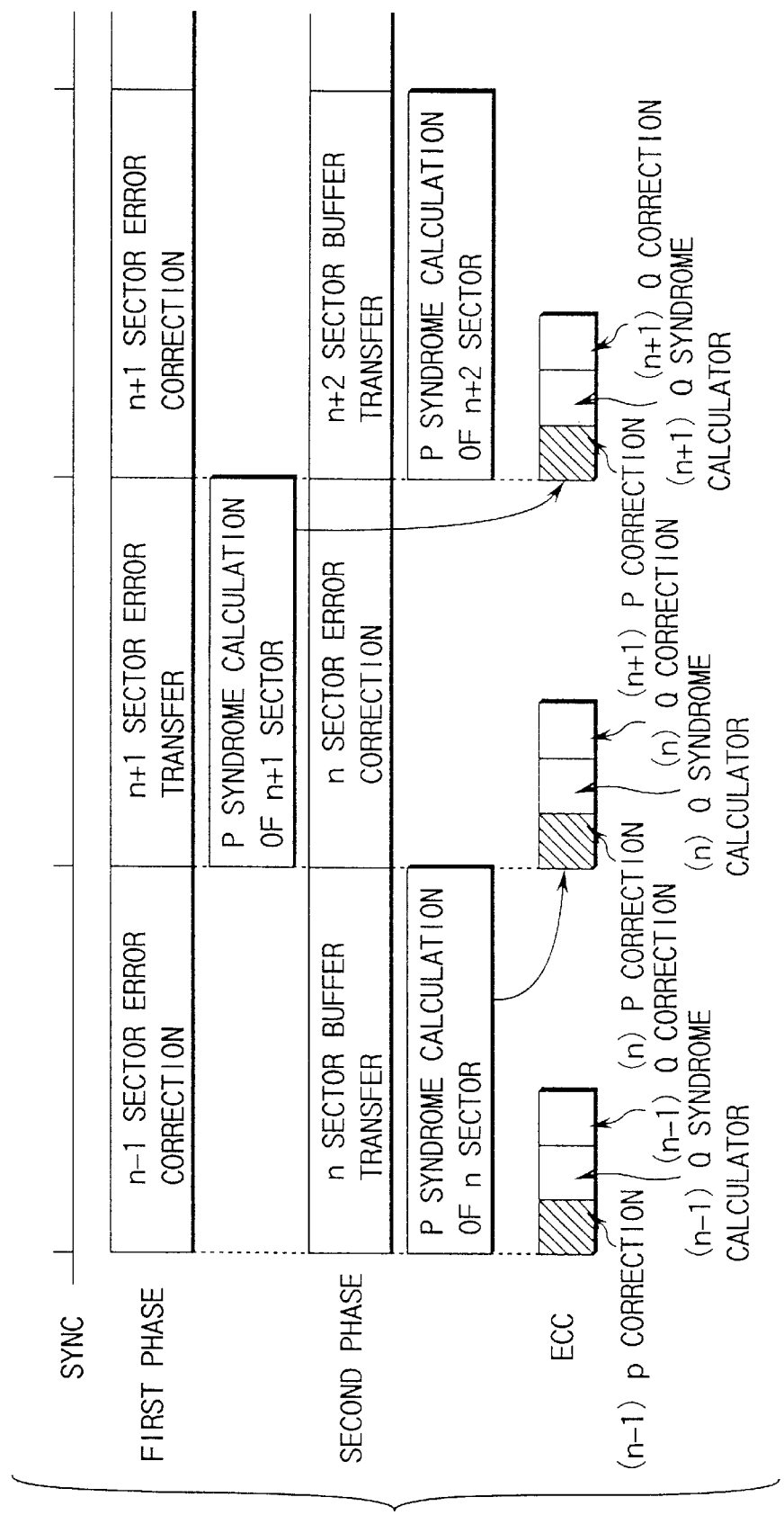
FIG. 16 is a view showing an operation of a third embodiment of the present invention.

The third embodiment of the present invention performs, as shown in FIG. 16, the calculation of the above-mentioned syndrome, for example, in the P sequence of the n sector, while, at the same time, writing the data into the buffer RAM at the n sector. By such a structure, the first P correction can be made at high speeds and it is possible to shorten the whole error correction time. Further, there is a further advantage in that, since the buffer access involved in the calculation of the syndrome can be shortened, the remaining time can be used for data transfer to the host computer. There are sometimes the cases where, though being dependent upon the data, P- and Q-corrections are repeated a plurality of times. For the second and subsequent P corrections, the error correction circuit gains access to the buffer RAM. In FIG. 6, however, the first P- and Q-corrections are shown for convenience sake.

As explained in conjunction with FIG. 13, it is at a MODE1 format and MODE2-FORM1 format that, at a CD-ROM format, the error correction is performed.

Figure 17:
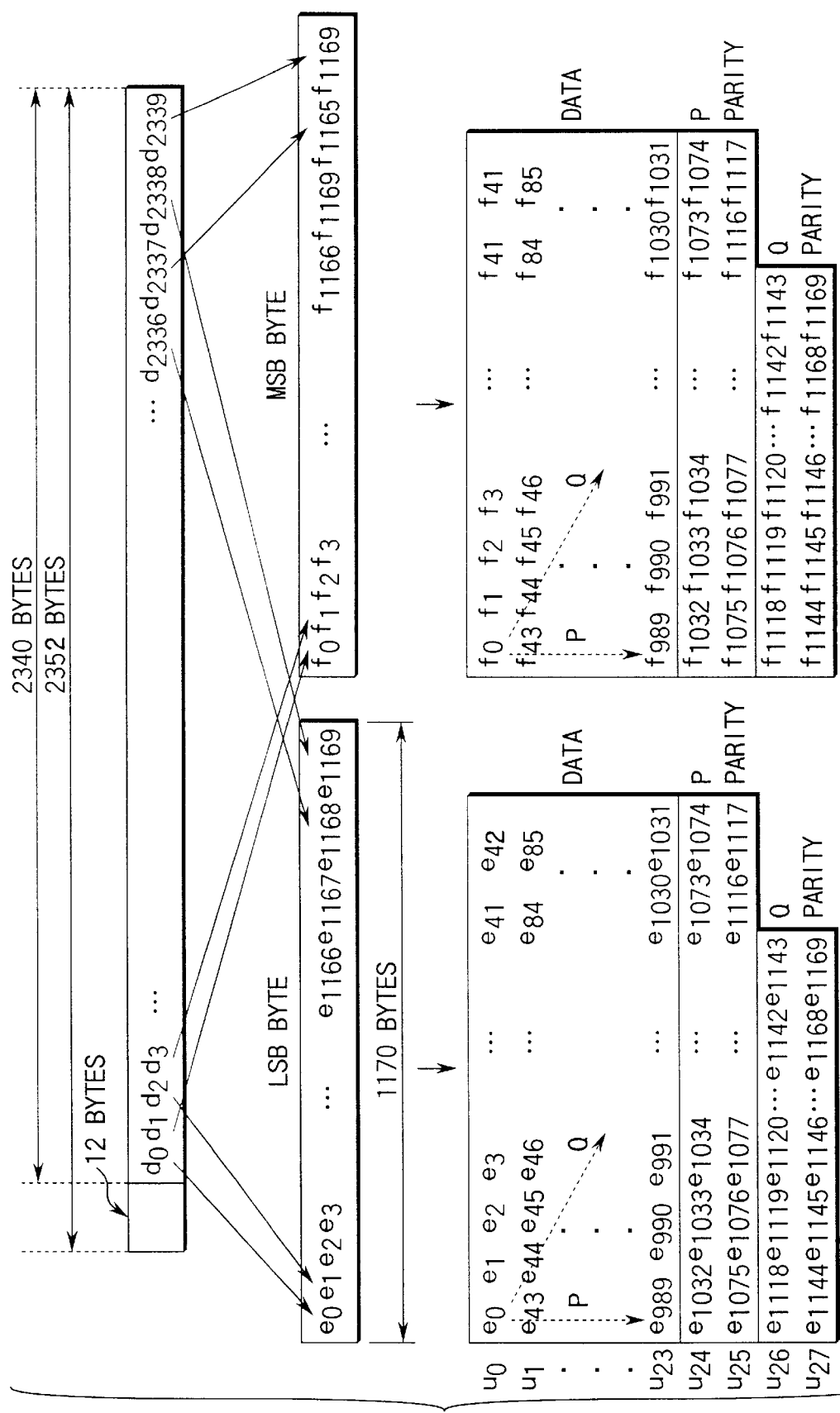
FIG. 17 is a view showing an operation of a third embodiment of the present invention, showing a data handling at a MODE1.

In the MODE1 format, as shown in FIG. 17, 2340 bytes are separated into two phases of LSB bytes of 1170 bytes and MSB bytes of 1170 bytes. The data in the respective phase becomes a format as indicated below. That is, one P correction can be performed using 24 byte data ($u_0$ to $u_{23}$) and 2 byte P parities ($u_{24}$, $u_{25}$) lengthwise. These are 43 columns, so that 26×43=1118 byte data. The P sequence syndrome is given by the following equations (15), (16).

$$S_0 = u_0 + u_1 + \ldots + u_{24} + u_{25} \tag{15}$$

$$S_1 = \alpha^{25} u_0 + \alpha^{24} u_1 + \ldots + \alpha u_{24} + u_{25} \tag{16}$$

Figure 18:
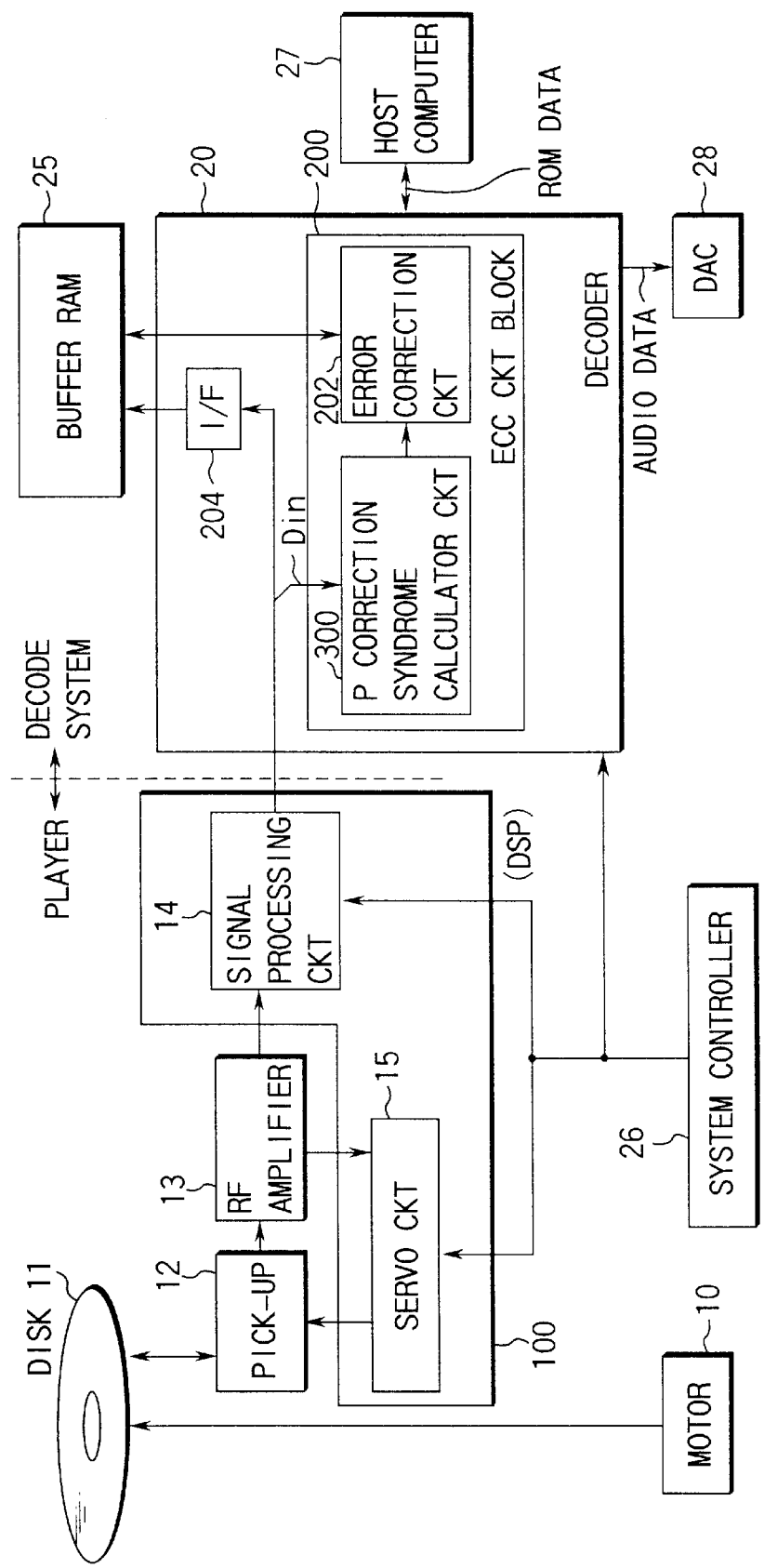
FIG. 18 is a block diagram showing a player for a disk including a P sequence syndrome calculation circuit in the third embodiment of the present invention and a decode system.

FIG. 18 shows a third embodiment of the present invention. In FIG. 18, the same reference numerals are employed to designate parts or elements corresponding to those shown in FIG. 14 and only different parts or elements will be explained below. In this embodiment, as set out above, the P correction syndrome is calculated at the same time the input data is written into the buffer RAM. Therefore, a P correction syndrome calculation circuit 30 is provided at a preceding stage of an error correction circuit 202. That is, the P correction syndrome calculation circuit 300 is provided between a signal processing circuit 14 and the error correction circuit 202. The input data supplied from the signal processing circuit 14 to a decoder 20 is written via an interface circuit 204 to a buffer RAM 25 and, at the same time, supplied to the P correction syndrome calculation circuit 300 where a P correction syndrome is calculated. Incidentally, the P-correction syndrome calculation circuit 300 and error correction circuit 202 constitute an ECC circuit block 200 and the signal processing circuit 14 and servo circuit 15 constitute a DSP (Disk Servo Processor) 100.

Figure 19:
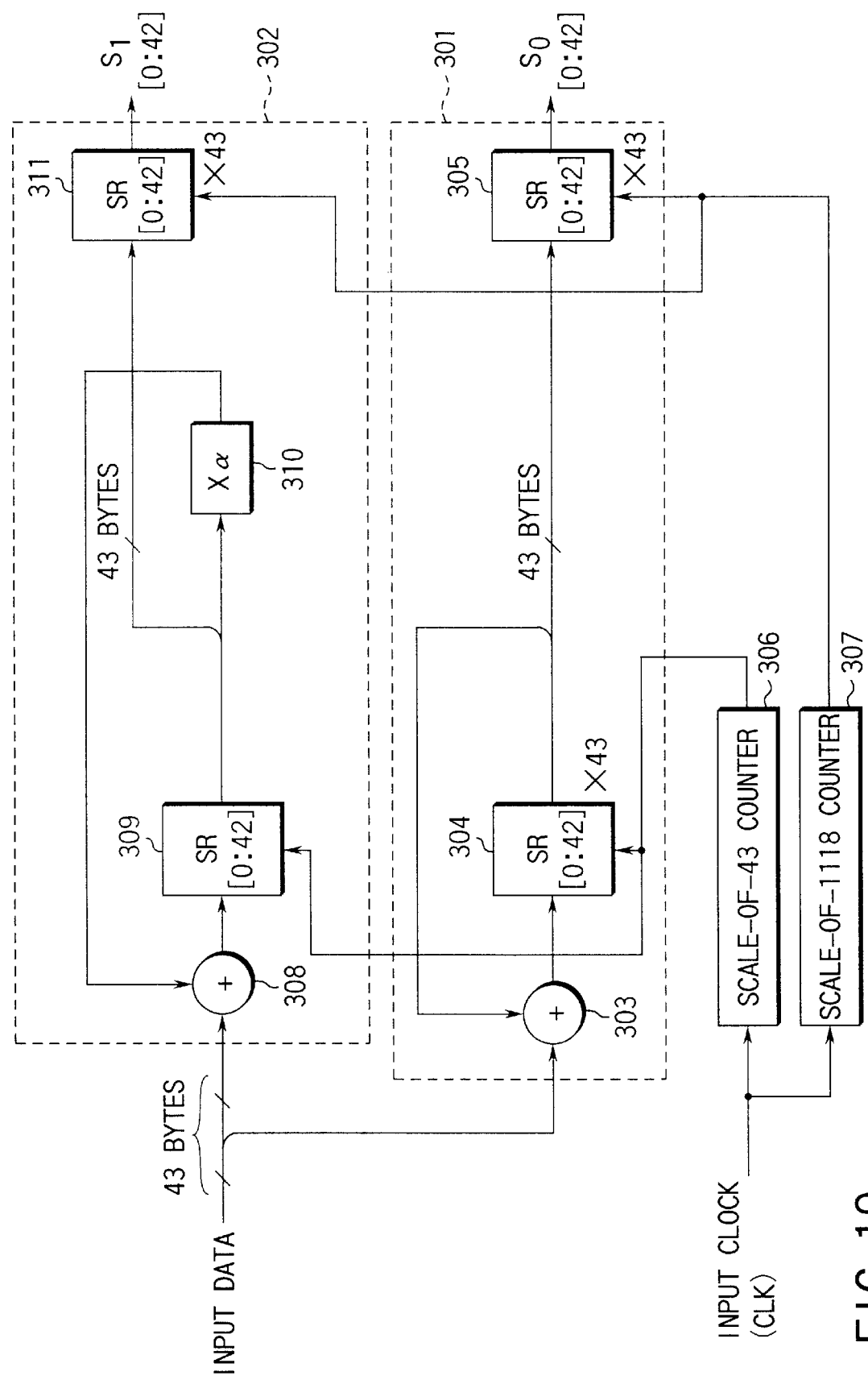
FIG. 19 is a circuit diagram showing a P correction syndrome calculation circuit at a MODE1 in the third embodiment of the present invention.

FIG. 19 is a practical circuit arrangement of the P correction syndrome calculation circuit 300 in FIG. 18, showing a P correction syndrome calculation circuit of a MODE1. This circuit calculates input data sequentially in accordance with the equations (15), (16).

In FIG. 19, an $S_0$ syndrome calculation circuit 301 for calculating a P sequence 43 column $S_0$ comprises an EX-OR 303 serving as an adder, 43 shift registers 304 and 43 shift registers 305. The shift register 304 is controlled by an output signal of a scale-of-43 counter 306 and the shift register 305 is controlled by an output signal of a scale-of-1118 counter 307. A clock signal CLK is supplied to the scale-of-43 counter 306 and to the scale-of-1118 counter 307. The scale-of-43 counter 306 outputs a high level signal while counting, for example, 43 clock signals CLK and a low level signal each time it has counted 43 clock signals. Further, the scale-of-1118 counter 307 outputs a high level signal while counting 1118 clock signals CLK and outputs a low level signal each time it has counted the 1118 clock signals.

An $S_1$ syndrome calculation circuit 302 for calculating the P sequence 43 column $S_1$ comprises an EX-OR 308 serving as an adder, 43 shift registers 309, multiplier 310, and 43 shift registers 311. The shift register 309 is controlled by an output signal of the scale-of-43 counter 306 and the shift register 311 is controlled by an output signal of the scale-of-1118 counter 307.

It is to be noted that FIG. 19 shows only the circuits for calculating the $S_0$ and $S_1$ syndromes with respect to the data $e_0$ to $e_{1117}$ on the LSB bytes side as shown in FIG. 17. In actuality, $S_0$ and $S_1$ syndromes need to be similarly calculated with respect to the data $f_0$ to $f_{1117}$ on the MSB bytes side in FIG. 17. Therefore, as the circuit shown in FIG. 19 use is made of two systems and, in total, 43×2×2×2=344 registers are necessary.

In the above-mentioned circuit arrangement, when the $S_0$ syndrome is calculated, the input data $e_0$ to $e_{42}$ are supplied to the shift register 304, in accordance with the output signal of the scale-of-counter 306, and latched. Then, the input data $e_{43}$ to $e_{85}$ and $e_0$ to $e_{42}$ latched to the shift registers 304 are added by the EX-OR 303 and latched to the shift registers 304. Such an operation is thus repeated and, at a time point when the P parity data from $e_{1075}$ to $e_{1117}$ have been input, the $S_0$ syndrome satisfying the equation (15) is calculated over 43 columns. This calculated $S_0$ syndrome is supplied to the 43 shift registers 305 controlled by the output signal of the scale-of-1118 counter 307 and is latched. That is, the next subsequent data is sent to the decode system side and written into the buffer RAM and, while the calculation is performed by the P-correction syndrome calculation circuit, a calculation result of a syndrome relating to data of a one-previous sector as an object of the error correction continues to be retained in the subsequent stage shift register 305.

Then when the $S_1$ syndrome is calculated, the input data $e_0$ top $e_{42}$ are supplied to the shift register 309, as in the case of the $S_0$, in accordance with a signal output from the scale-of-43 counter and latched. Then the data $e_0$ to $e_{42}$ latched to the shift register 309 are multiplied by $\alpha$ by the multiplier 310 and supplied to the EX-OR 308 and added to the input data $e_{43}$ to $e_8$. The result of the addition is latched to the shift register 30. Such an operation is repeated and, at a time point when the P parity data from $e_{1075}$ to $e_{1117}$ are inputted, the Si syndrome satisfying the above-mentioned equation (16) is calculated over 43 columns. This calculated $S_1$ syndrome is supplied to the 43 shift register 311 controlled by an output signal of the scale-of-1118 counter 307 and latched while effecting error correction processing.

The error correction circuit 202 shown in FIG. 18 calculates an error location on the basis of a result of calculation of the P-correction syndrome calculation circuit 300 and the P correction is done on error data in the buffer RAM 25 in accordance with the calculated location. In this connection it is to be noted that an algorithm may be so made that, when the calculation results of P-correction syndromes based on the equations (15), (16) are "0" in any of all 43 columns and it is found that there is no error in each column, the error correction circuit 202 effects a calculation of a Q-correction sequence syndrome while omitting a first P correction.

Thereafter, the error correction circuit 202, while gaining access to the written data in the buffer RAM 25, effects a calculation of a Q correction sequence syndrome based on the following equations (15'), (16') and, as required, a calculation of an error location and error data correction. Here, when, as a calculation result of the Q-correction sequence syndrome, the Q correction is necessary and correction is made on the error data, then a corresponding error-corrected data is newly supplied for the P correction sequence syndrome calculation. In this case, it is required that the error correction circuit 202 perform a calculation of a P-correction sequence syndrome while gaining access to the data in the buffer RAM 25.

$$S_0 = u_0 + u_1 + u_{43} + u_{44} \tag{15'}$$

$$S_1 = \alpha^{44} u_0 + \alpha^{43} u_1 + \ldots + \alpha u_{43} + u_{44} \tag{16'}$$

Figure 20:
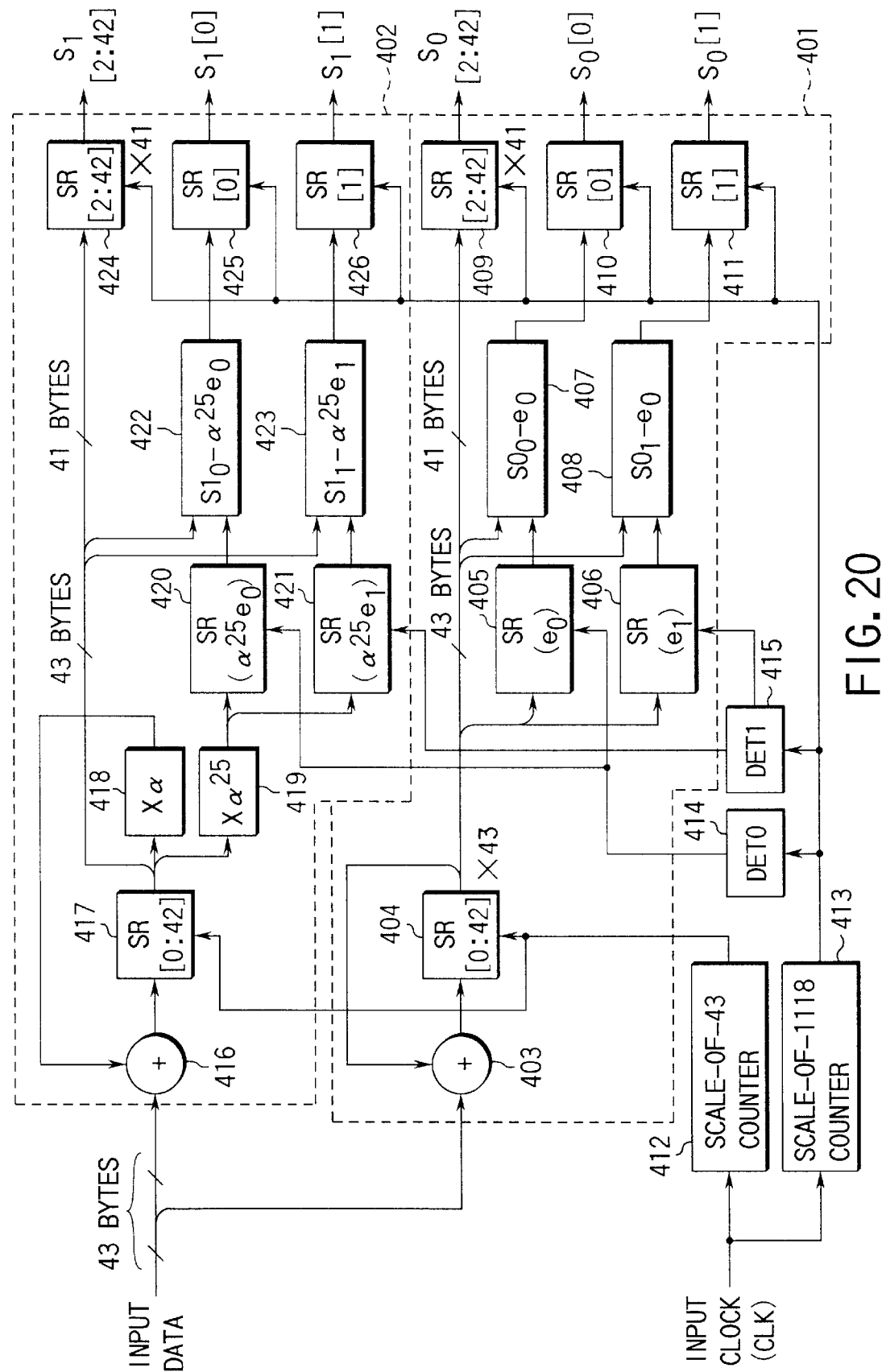
FIG. 20 is a circuit diagram showing the P correction syndrome calculation circuit at a MODE2 FORM1 format in the third embodiment of the present invention.

FIG. 20 shows a P correction syndrome calculation circuit of a MODE2 FORM1 format according to a third embodiment of the present invention.

In the MODE2 FORM1 format, as shown in FIG. 17, 2336 bytes excluding HEADER's four bytes ($d_0$ to $d_3$=0 and hence $e_0 = e_1 = f_0 = f_1 = 0$) are in an error correction range.

The calculation of the $S_0$ syndrome can be made by latching the calculation result of the MODE1 and data $e_0$, $e_1$, $f_0$, $f_1$ and finally subtracting any of the data $e_0$, $e_1$, $f_0$, $f_1$ from the result of calculation.

Substituting data $e_0$, $e_1 = 0$ into $u_0$, $u_1$ and remaining data $e_{43} \ldots e_{1076}$ into $u_2 \ldots u_{25}$ gives equations (17), (18).

$$\text{0-th column } SO_0 = 0 + e_{43} + \ldots + e_{1032} + e_{1075} \tag{17}$$
$$= e_{43} + \ldots + e_{1032} + e_{1075}$$

$$\text{1st column } SO_1 = 0 + e_{44} + \ldots + e_{1033} + e_{1076} \tag{18}$$
$$= e_{44} + \ldots + e_{1033} + e_{1076}$$

For a MODE1-$e_0$, $e_1$, on the other hand, the following equations (19), (20) result.

$$\text{0-th column } SO_0 = e_0 - e_0 + e_{43} + \ldots + e_{1032} + e_{1075} \tag{19}$$
$$= e_{43} + \ldots + e_{1032} + e_{1075}$$

$$\text{1st column } SO_1 = e_1 - e_1 + e_{44} + \ldots + e_{1033} + e_{1076} \tag{20}$$
$$= e_{44} + \ldots + e_{1033} + e_{1076}$$

Thus, the equation (17)=the equation (19) and the equation (18)=the equation (20). And the equations (19), (20) can be proved correct. Since similar proof can be made for data $f_0$, $f_1$, $S_0$ syndrome at a MODE2 FORM1 can be calculated.

$S_1$ syndrome calculation is also done by latching a calculation result of $\alpha^{25} e_0$, $\alpha^{25} e_1$, $\alpha^{25} f_0$, $\alpha^{25} f_1$ and finally subtracting the latched calculation result from a result of the MODE1. Substituting the data $e_0$, $e_1 = 0$ into $u_0$, $u_1$ and remaining data $e_{43} \ldots e_{1076}$ into $u_2 \ldots u_{25}$ gives equations (21) (22).

$$\text{0-th column } SI_1 = \alpha^{25} \times 0 + \alpha^{24} e_{43} + \ldots + \alpha e_{1032} + e_{1075} \tag{21}$$
$$= \alpha^{24} e_{43} + \ldots + \alpha e_{1032} + e_{1075}$$

$$\text{1st column } SI_1 = \alpha^{25} \times 0 + \alpha^{24} e_{44} + \ldots + \alpha e_{1033} + e_{1076} \tag{22}$$
$$= \alpha^{24} e_{44} + \ldots + \alpha e_{1033} + e_{1076}$$

For MODE1-$\alpha^{25} e_0$, $\alpha^{25} e_1$, $$\text{0-th column } SI_0 = \alpha^{25} e_0 - \alpha^{25} e_0 + \alpha^{24} e_{43} + \ldots + \tag{23}$$
$$\alpha e_{1032} + e_{1075}$$
$$= \alpha^{24} e_{43} + \ldots + \alpha e_{1032} + e_{1075}$$

-continued $$\text{1st column } S1_1 = \alpha^{25}e_1 - \alpha^{25}e_1 + \alpha^{24}e_{44} + \ldots + \alpha e_{1033} + e_{1076}$$
$$= \alpha^{24}e_{44} + \ldots + \alpha e_{1033} + e_{1076} \quad (24)$$

Since the equation (21)=(23) and the equation (22)=(24), the equation (23) can be proved correct. Further, similar proof can be made even for the data $f_0$, $f_1$ and hence it is possible to calculate the $S_1$ syndrome in the MODE2 FORM format.

FIG. 20 shows a circuit arrangement of the P correction syndrome calculation circuit 300 shown in FIG. 18, showing a P correction syndrome calculation circuit of the MODE2 FORM1 format. This circuit sequentially calculates inputting data in accordance with the equations (19) (20) and equations (23) (24). In FIG. 20, the P correction syndrome calculation circuit comprises an $S_0$ syndrome calculation circuit 401 for calculating the P sequence 43 column $S_0$ and an $S_1$ syndrome calculation circuit 402 for calculating the P sequence 43 column $S_1$.

An $S_0$ syndrome calculation circuit 401 for calculating the P sequence 43 column $S_0$ comprises an EX-OR 403 serving as an adder, 43 shift registers 404, shift registers 405, 406, subtracters 407, 408, 41 shift registers 409 for latching a calculation result of 2nd to 42nd columns, shift register 410 for latching the 0-th calculation result $S0_0$ and shift register 411 for latching the 1st calculation result $S0_1$.

The shift register 405 latches data $e_0$ and the shift register 406 data $e_1$. The subtracter 407 subtracts the data $e_0$ which is latched to the shift register 405 from a calculation result of the MODE1 which is output from the shift register 404. The subtracter 408 subtracts data $e_1$ which is latched to the shift register 406 from a calculation result of the MODE1.

A scale-of-43 counter 41 counts 43 clock signals CLK and a scale-of-1118 counter 413 counts 1118 clock signals CLK. The shift register 404 is controlled by an output signal of the scale-of-43 counter 412. A detection circuit (DET0) 414 is comprised of, for example, a decoder. This circuit decodes an output signal of the scale-of-1118 counter 412 and detects a "0". A detection circuit (DET1) 415 is comprised of a decoder. This circuit decodes the output signal of the scale-of-1118 counter 412 and detects a "1". The output signal of the detection circuit 414 is supplied to the shift register 405 and an output signal of the detection circuit 415 is supplied to the shift resister 406. Further, the shift registers 409, 410 and 411 are controlled by the output signal of the scale-of-1118 counter 412.

On the other hand, an $S_1$ syndrome calculation circuit 402 for calculating the P sequence 43 column $S_1$ comprises an EX-OR 416 serving as an adder, 43 shift registers 417, multiplier 418, multiplier 419, shift registers 420, 421 latching output data of the multiplier 419, subtracters 422, 423, 41 shift registers 424 for latching a result of calculation of 2nd to 42-th columns and shift register 425 for latching a 0-th column calculation result $S1_0$, and a shift register 426 for latching a 1-th column calculation result $S1_1$.

The multiplier 418 multiplies the output data of the shift register 417 by $\alpha$ and the multiplier 419 multiplies the output data of the shift register 417 by $\alpha^{25}$. The shift register 420 latches the output data $\alpha^{25}e_0$ of the multiplier 419 and the shift register 421 latches output data $\alpha^{25}e_1$ of the multiplier 419. The subtracter 422 subtracts the output data of the shift register 420 from a calculation result $S1_0$ of the MODE1 and the subtracter 423 subtracts the output data of the shift register 421 from a count result $S1_1$ of the MODE1.

The shift register 417 is controlled by the output signal of the scale-of-43 counter 412. The shift register 420 is controlled by the output signal of the detection circuit 414. The shift register 421 is controlled by the output signal of the detection circuit 415. Further, the shift registers 424, 425 and 426 are controlled by the output signal of the scale-of-118 counter 412.

It is to be noted that FIG. 20 simply shows the $S_0$ and $S_1$ syndrome calculation circuits in conjunction with data $e_0$ to $e_{1117}$ on the LSB side shown in FIG. 17. In actuality, however, it is necessary to similarly calculate $S_0$ and $S_1$ syndromes even for the data $f_0$ to $f_{1117}$ on the MSB byte side shown in FIG. 17. Therefore, it is necessary to have the FIG. 20 circuit in two systems.

In the above-mentioned circuit, when the $S_0$ syndrome is calculated, input data $e_0$ to $e_{42}$ are supplied to the shift register 404 in accordance with the output signal of the scale-of-43 counter 412. The data $e_0$ to $e_{42}$ latched to the shift register 404 and input data e43 to $e_{85}$ are added by the EX-OR 403 and a result is latched to the shift register 404. When, at this time, the detector 414 decodes the output signal of the scale-of-1118 counter 412 and detects a "0", the shift register 405 latches the data $e_0$ in accordance with an output of the detection circuit 414. When, on the other hand, the detection circuit 415 decodes an output signal of the scale-of-1118 counter 412 and detects a "1", the shift register 406 latches the data $e_1$ in accordance with an output signal of the detection circuit 415.

The MODE1 is calculated by adding all the input data. The input data is repeatedly added by the EX-OR 403 and shift register 404 and, at a time point when P parity data $e_{1075}$ to $e_{1117}$ have been inputted, the $S_0$ syndrome is calculated over the 43 columns. The subtracter 407 subtracts the data $e_0$ which is latched to the shift register 405 from a calculation result $S0_0$ of S0. The subtracter 408 subtracts data $e_1$ which is latched to the shift register 406 from a calculation result $S0_1$ of S0. Out of the thus calculated $S_0$ syndrome, the 0-th and 1st columns are latched to the shift registers 410, 411 controlled by the output signal of the scale-of-1118 counter 413 and the remaining 41 bytes are latched to the shift register 409 by the output signal of the scale-of-counter 413.

On the other hand, when the $S_1$ syndrome is calculated, the input data $e_0 \ldots e_{42}$ are supplied to the shift register 417 in accordance with the output signal of the scale-of-43 counter 412 and latched. Then the latched data $e_0 \ldots e_{42}$ of the shift register 417 are multiplied by $\alpha$ by the multiplier 418 and a result is supplied to the EX-OR 416 where the input data $e_{43}$ to $e_{85}$ are added. An addition result is latched to the shift register 417. When, at this time, the detection circuit 414 decodes an output signal of the scale-of-1118 counter 412 and detects "0", the shift register 420 latches the data $\alpha^{25}e_0$ from the multiplier 419 in accordance with an output signal of the detection circuit 414. Further when the detection circuit 415 decodes the output signal of the scale-of-1118 counter 412 and detects "1", the shift register 421 latches the data $\alpha^{25}e_1$ from the multiplier 419 in accordance with the output signal of the detection circuit 415.

At a time point when the input data is repeatedly added by the EX-OR 416 and shift register 417 and the data inputting has been ended from the P parity data $e_{1075}$ to $e_{1117}$, the $S_1$ syndrome is calculated over 47 columns. The subtracter 422 subtracts the data $\alpha^{25}e_0$ latched to the shift register 420 from an $S_1$ calculation result $S1_0$ and the subtracter 423 subtracts the data $\alpha^{25}e_1$ latched to the shift register 421 from an $S_1$ calculation result $S1_1$. Out of the $S_1$ syndrome thus calculated, the 0-th and 1st columns are latched to the shift registers 425, 426 controlled by the output signal of the scale-of-1118 counter 413 and the remaining 41 bytes are latched to the shift register 424 by an output signal of the scale-of-1118 counter 413.

The output data of the P correction syndrome calculation circuit 300 at the above-mentioned MODE2 FORM1 format is supplied to the error correction circuit 202 shown in FIG. 18 where, as in the above-mentioned MODE1 format, an error correction is made.

According to the third embodiment, the one-sector data is written into the buffer RAM25 and, at the same time, the P correction syndrome is calculated and, while referring to this calculation result, it is possible to perform error correction. Therefore, an error detection capability can be improved by effecting checking with the use of the EDC.

Further, even in the case where an error is present, the writing of the data into the buffer RAM 25 and, at the same time, the calculation of the P correction syndrome are completed and, for the calculation of the P correction syndrome, no access need be gained to the buffer RAM 25. It is thus possible to immediately calculate an error location and correct the error at the location.

Further, initial P correction can be made immediately after the writing of the data into the buffer RAM 25 is completed. For this reason, the P correction is made based on the P correction syndrome and, with the use of the Q correction, the result of the P correction is checked for no error, by which it is possible to complete correction in about half the time compared with the time required in the conventional technique.

As shown in FIG. 16, access to the buffer RAM 25 for syndrome calculation is effected for the Q sequence, so that the number of accesses to the buffer RAM 25 is reduced to about ½. Even if high-speed CD reproduction has to be achieved in view of the shortening of the calculation time, it is possible to transfer the data to the host computer with an adequate time allowance.

In the case where, from a calculation result of the P correction syndrome calculation circuit 300, it is decided that there is no error, it follows that, since the first P correction processing is also omitted, data can be transferred at high speeds to the host computer. If, in particular, the cached data is host transferred not in realtime, a loss in capability of an associated circuit resulting from a waste error correction can be prevented.

Figure 21:
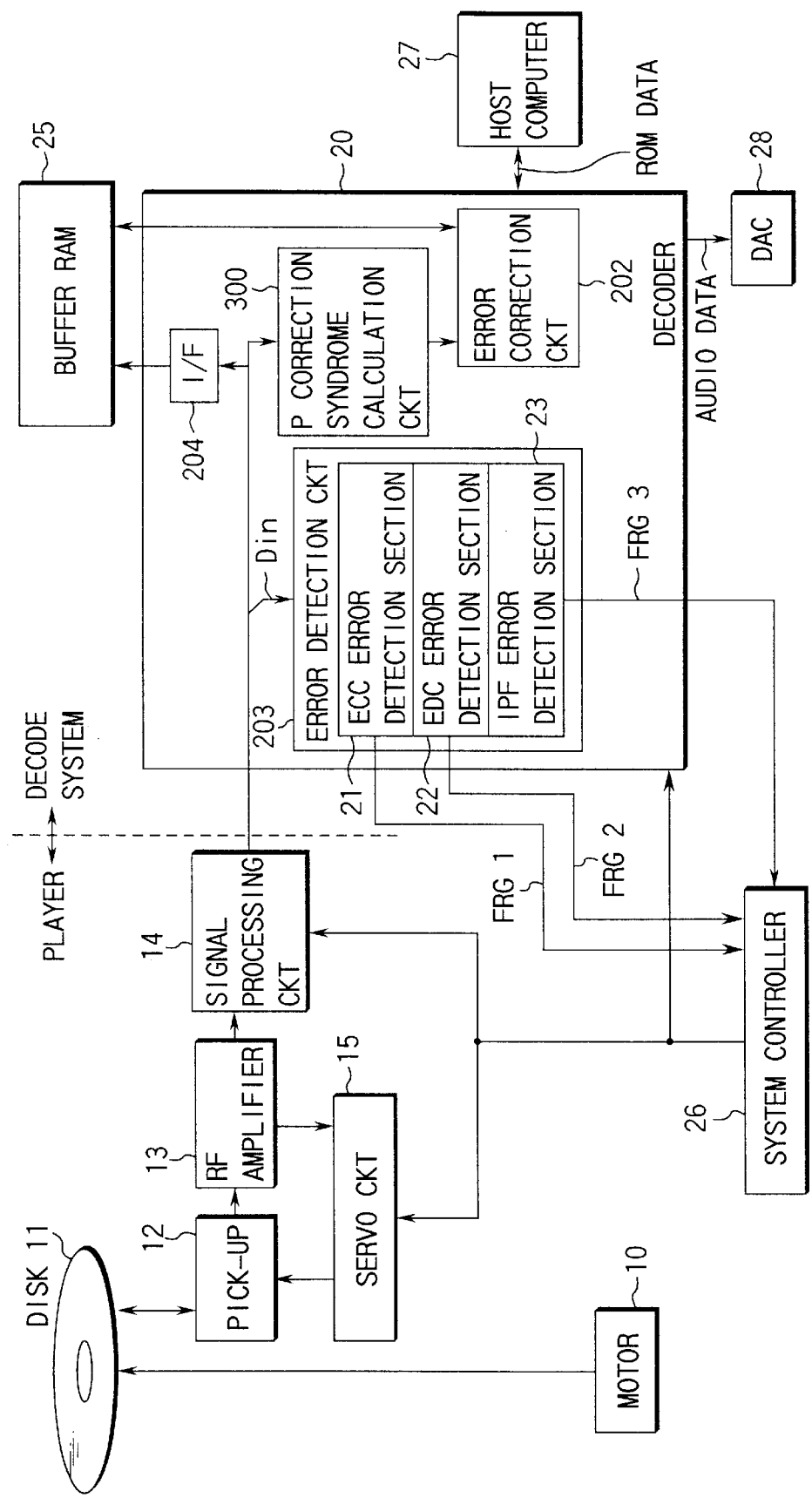
FIG. 21 is a block diagram view showing a modification of FIG. 18.

FIG. 21 shows a modification of the circuit shown in FIG. 18 and shows a combination of the circuit as shown in FIG. 18 and the ECC error detection section 21, EDC error detection section 22 and IPF error detection section 23 as shown in FIG. 14. In such an arrangement, it is possible to jointly use error detection results of the ECC error detection section 21, EDC error detection section 22 and IPF error detection section 23 and to improve error detection accuracy.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An error detection circuit, comprising:
an ECC error detection circuit configured to receive from a disk a set of data containing ECC parity information and to calculate a syndrome for at least one of a P correction and a Q correction to said set of data so as to produce an error detection result; and
a latch device configured to retain said final error detection result, wherein said ECC error detection circuit comprises
a first calculation circuit configured to determine whether or not a sum of all columns of a P correction $S_0$ is "0",
a second calculation circuit configured to determine whether or not a sum of all columns of a P correction $S_1$ is "0",
a third calculation circuit configured to determine whether or not a sum of all columns of a Q correction $S_0$ is "0", and
a fourth calculation circuit configured to determine whether or not a sum of all columns of a Q correction $S_1$ is "0".

2. A circuit according to claim 1, further comprising:
a first calculation latch circuit connected to the first calculation circuit and configured to retain a first calculation result;
a second calculation latch circuit connected to the second calculation circuit and configured to retain a second calculation result;
a third calculation latch circuit connected to the third calculation circuit and configured to retain a third calculation result; and
a fourth calculation latch circuit connected to the fourth calculation circuit and configured to retain a fourth calculation result.

3. A decode system, comprising:
a decoder configured to receive from a disk a set of data containing ECC parity information; and
a memory connected to the decoder and configured to store the data containing the ECC parity information, wherein
the decoder comprises an error detection circuit configured to calculate a syndrome at least one of a P correction and a Q correction to said set of data, said error detection circuit comprising
a first calculation circuit configured to determine whether or not a sum of all columns of a P correction $S_0$ is "0",
a second calculation circuit configured to determine whether or not a sum of all columns of a P correction $S_1$ is "0",
a third calculation circuit configured to determine whether or not a sum of all columns of a Q correction $S_0$ is "0", and
a fourth calculation circuit configured to determine whether or not a sum of all columns of a Q correction $S_1$ is "0".

4. A system according to claim 3, further comprising:
a first calculation latch circuit connected to the first calculation circuit and configured to retain a first calculation result;
a second calculation latch circuit connected to the second calculation circuit and configured to retain a second calculation result;
a third calculation latch circuit connected to the third calculation circuit and configured to retain a third calculation result; and
a fourth calculation latch circuit connected to the fourth calculation circuit and configured to retain a fourth calculation result.

5. A system according to claim 3, further comprising:
an interface circuit connected to an input section of the memory and configured to write the set of data into the memory.

6. A system according to claim 3, further comprising:
a controller connected to the error detection circuit and configured to determine whether or not an error has been found in the data on the basis of at least one of the first calculation result, the second calculation result, the third calculation result, and the fourth calculation result.

7. A system according to claim 6, further comprising:
an error correction circuit provided in the decoder and configured to correct an error in the set of data when the controller determines that an error has been found in the set of data.

8. A system according to claim 3, wherein the first calculation circuit comprises:
a first adder having first adder first input terminal, a first adder second input terminal, and a first adder output terminal, the first adder first input terminal configured to receive a P sequence; and
a first register having a first register input terminal and a first register output terminal, the first register input terminal connected to the first adder output terminal, and the first register output terminal connected to the first adder second input terminal.

9. A system according to claim 8, wherein the second calculation circuit comprises:
a second adder having a second adder first input terminal, a second adder second input terminal, and a second adder output terminal, the second adder first input terminal configured to receive said P sequence;
a second register having a second register input terminal and a second register output terminal, the second register input terminal connected to the second adder output terminal;
a first multiplier connected to the second register output terminal and configured to multiply an output of the second register by a first constant;
a first counter configured to count an n number of clock signals and to output one of a first counter first output signal corresponding to when the first counter counts the clock signal and a first counter second output signal corresponding to when the first counter counts the n number of clock signals; and
a first selector having a first selector first input terminal connected to the second register output terminal, a first selector second input terminal connected to the first multiplier output terminal, a first selector control input terminal connected to the first counter, and a first selector output terminal connected to the second adder second input terminal, wherein
the first selector is configured to select the first selector first input terminal when the first counter outputs the first counter first signal and the first selector second input terminal when the first counter outputs the first counter second signal.

10. A system according to claim 9, wherein the third calculation circuit comprises:
a third adder having a third adder first input terminal, a third adder second input terminal, and a third adder output terminal, the third adder first input terminal configured to receive a Q sequence; and
a third register having a third register input terminal and a third register output terminal, the third register input terminal connected to the third adder output terminal and the third register output terminal connected to the third adder second input terminal.

11. A system according to claim 10, wherein the fourth calculation circuit comprises:
a fourth adder having a fourth adder first input terminal, a fourth adder second input terminal and a fourth adder output terminal, the fourth adder first input terminal configured to receive said Q sequence;
a fourth register having a fourth register input terminal connected to the fourth adder output terminal and a fourth register output terminal configured to output terminal Q parity as a fourth register output;
a second multiplier connected to the fourth register output terminal and configured to multiply a fourth register output by said first constant so as to produce a second multiplier output having a plurality of column data of the Q sequence;
a third multiplier connected to the fourth register output terminal and configured to multiply a fourth register output by a second constant so as to produce a final data column;
a first transfer gate having a first transfer gate input terminal connected to the second multiplier output terminal and a first transfer gate output terminal connected to the fourth adder second input terminal, the first transfer gate configured to allow a passage of the second multiplier output;
a second transfer gate having a second transfer gate input terminal connected to the third multiplier output terminal and a second transfer gate output terminal connected to the the fourth adder second input terminal, the second transfer gate configured to allow passage of the third multiplier output; and
a third transfer gate having a third transfer gate input terminal connected to the fourth register output terminal and a third transfer gate output terminal connected to the fourth adder second input terminal, the third transfer gate configured to allow passage of the fourth register output.

12. A decode system comprising:
a memory configured to store a set of data reproduced from a disk, said set of data comprising ECC parity information, an error detection code (EDC), and an interpolation flag (IPF);
a first error detection circuit configured to retrieve the set of data from the memory and to calculate a syndrome for at least one of a P-correction and Q-correction of said set of data;
a second error detection circuit configured to retrieve the set of data from the memory and to calculate a polynomial P(x)=(x16+x15+x2+1)(x16+x2+x+1) so as to detect the EDC; and
a third error detection circuit configured to retrieve the set of data from the memory and to detect the IPF.

13. A system according to claim 12, further comprising:
a controller connected to each of the first error detection circuit, the second error detection circuit, and the third error detection circuit, the controller configured to determine whether or not an error condition is present in the set of data on the basis of a calculation result supplied by each of the first error detection circuit, the second error detection circuit, and the third error detection circuit.

14. A system according to claim 13, further comprising:
an error correction circuit connected to the memory and configured to correct said error condition.

15. A decode system comprising:
a memory configured to receive a set of data reproduced from a disk, said set of data comprising ECC parity information; and
a decoder connected to the memory, configured to retrieve said set of data, and including a calculation circuit to calculate a P correction syndrome, said calculation circuit comprising
a first counter configured to count an n number of clock signals and to output one of a first counter first output signal corresponding to when the first counter counts the clock signal and a first counter second output signal corresponding to when the first counter counts clock signals corresponding to a number of P sequence columns,
a first adder having a first adder first input terminal, a first adder second input terminal, and first adder output terminal, the first input terminal configured to receive a P sequence,
a plurality of first registers each having a first register input terminal and a first register output terminal, wherein each of the first register input terminals are connected to the first adder output terminal, each of the first register output terminals connected to the first adder second input terminal, and each of the plurality of first registers is configured to latch data corresponding to the number of P sequence columns in accordance with the first counter first output signal and to output first register latched data to the first adder in accordance with the first counter second output signal,
a second adder having a second adder first input terminal, a second adder second input terminal, and a second adder output terminal, the second adder first input terminal configured to receive said P sequence,
a plurality of second registers each having a second register input terminal and a second register output terminal, wherein the respective second register input terminals are connected to the second adder output terminal, and each of the plurality of second registers is configured to latch data corresponding to the number of P sequence columns in accordance with the first counter first output signal and to output second register latched data in accordance with the first counter second output signal,
a first multiplier connected to the second register output terminal and configured to multiply the data supplied from the second register by a first constant and supplying a result to the second adder second input terminal,
a second counter configured to count clock signals corresponding to a single data sector and outputting a second counter output signal, and
a plurality of third registers and a plurality of fourth registers, each of the plurality of third registers and plurality of fourth registers connected to a corresponding one of the plurality of first registers and one of the plurality of second registers, each of said plurality of third registers configured to retain the first register latched data and the second register latched data in accordance with the second counter output signal.

16. A decode system according to claim 15, wherein said decoder comprises:
an error correction circuit connected to the calculation circuit and configured to refer to the P correction syndrome and to correct an error in said set of data.

17. A decode system comprising:
a memory configured to receive a set of data reproduced from a disk, said set of data comprising ECC parity information; and
a decoder connected to the memory, configured to retrieve said set of data, and including a calculation circuit to calculate a P correction syndrome, said calculation circuit comprising
a first counter configured to count an n number of clock signals and to output one of a first counter first output signal corresponding to when the first counter counts the clock signal and a first counter second output signal corresponding to when the first counter counts clock signals corresponding to a number of P sequence columns,
a first adder having a first adder first input terminal, a first adder second input terminal, and first adder output terminal, the first input terminal configured to receive a P sequence,
a plurality of first registers each having a first register input terminal and a first register output terminal, wherein each of the first register input terminals are connected to the first adder output terminal, each of the first register output terminals connected to the first adder second input terminal, and each of the plurality of first registers is configured to latch data corresponding to the number of P sequence columns in accordance with the first counter first output signal and to output first register latched data to the first adder in accordance with the first counter second output signal,
a second register having a second register input terminal and a second register output terminal, said second register input terminal connected to each output terminal of the plurality of first registers and configured to retain a first unit of data output by the plurality of first registers,
a third register having a third register input terminal and a third register output terminal, said third register input terminal connected to each output terminal of the plurality of first registers and configured to retain a second unit of data output by the plurality of first registers,
a first subtractor having a first subtractor first input terminal, a first subtractor second input terminal, and a first subtractor output terminal, the first subtractor first input terminal connected to each output terminal of the plurality of first registers, the first subtractor second input terminal connected to the second register output terminal, the first subtractor configured to subtract the first unit of data from a unit of addition data corresponding to a single sector output from the first registers,
a second subtractor having a second subtractor first input terminal, a second subtractor second input terminal, and a second subtractor output terminal, the second subtractor first input terminal connected to each output terminal of the plurality of first registers, the second subtractor second input terminal connected to the third register output terminal, the second subtractor configured to subtract the second unit of data from the unit of addition data corresponding to a single sector output from the first registers,
a second adder having second adder first input terminal, second adder second input terminal, and second adder output terminal, the second adder first input terminal configured to receive the P sequence, a plurality of fourth registers each having a fourth register input terminal and a fourth register output terminal, wherein each of the fourth register input terminals are connected to the second adder output terminal and each of the plurality of fourth registers is configured to latch data corresponding to the number of P sequence columns in accordance with the first counter first output signal and to output fourth register latched data in accordance with the first counter second output signal, a first multiplier having a first multiplier input terminal and a first multiplier output terminal, the first multiplier input terminal connected to each output terminal of the plurality of fourth registers, the first multiplier configured to multiply an output supplied by the fourth register by a first constant and to supply a first multiplier result to the second adder second input terminal, a second multiplier having a second multiplier input terminal and a second multiplier output terminal, the second multiplier input terminal connected to each output terminal of the plurality of fourth registers, the second multiplier configured to multiply an output supplied by the fourth register by a second constant and to supply a second multiplier result, a fifth register having a fifth register input terminal and a fifth register output terminal, the fifth register input terminal connected to the first multiplier output terminal and configured to retain the first multiplier result, a sixth register having a sixth register input terminal and a sixth register output terminal, the sixth register input terminal connected to the second multiplier output terminal and configured to retain the second multiplier result, a third subtractor having a third subtractor first input terminal, a third subtractor second input terminal, and a third subtractor output terminal, the third subtractor first input terminal connected to each output terminal of the plurality of fourth registers, the third subtractor second input terminal connected to the fifth register output terminal, the third subtractor configured to subtract the first multiplier result from a unit of addition data corresponding to a single sector output from the fourth registers, a fourth subtractor having a fourth subtractor first input terminal, a fourth subtractor second input terminal, and a fourth subtractor output terminal, the fourth subtractor first input terminal connected to each output terminals of the plurality of fourth registers, the fourth subtractor first input terminal connected to the sixth register output terminal, the fourth subtractor configured to subtract the second multiplier result from a unit of addition data corresponding to a single sector output from the fourth registers, a second counter configured to count clock signals corresponding to said single sector and to output a third signal, a seventh register having a seventh register input terminal and a seventh register output terminal, said seventh register input terminal connected to each output terminal of the plurality of first registers and configured to retain data output from the first registers in accordance with the third signal supplied by the second counter, an eighth register having an eighth register input terminal and an eighth register output terminal, said eighth register input terminal connected to the first subtractor output terminal and configured to retain data output from the first subtractor in accordance with the third signal supplied from the second counter, a ninth register having a ninth register input terminal and a ninth register output terminal, said ninth register input terminal connected to the second subtractor output terminal and configured to retain data output from the second subtractor in accordance with the third signal supplied from the second counter, a tenth register having a tenth register input terminal and a tenth register output terminal, said tenth register input terminal connected to each output terminal of the plurality of fourth registers and configured to retain data output from the fourth registers in accordance with the third signal supplied from the second counter, an eleventh register having an eleventh register input terminal and an eleventh register output terminal, said eleventh register input terminal connected to the third subtractor output terminal and configured to retain data output from the third subtractor in accordance with the third signal supplied from the second counter, and a twelfth register having a twelfth register input terminal and a twelfth register output terminal, said twelfth register input terminal connected to the fourth subtractor output terminal and configured to retain data output from the fourth subtractor in accordance with the third signal output from the second counter.

\* \* \* \* \*